(12) United States Patent
Haroun et al.

(10) Patent No.: US 11,653,568 B2
(45) Date of Patent: May 16, 2023

(54) INTEGRATED CIRCUIT STRESS SENSOR

(71) Applicant: TEXAS INSTRUMENTS INCORPORATED, Dallas, TX (US)

(72) Inventors: Baher Haroun, Allen, TX (US); Tobias Bernhard Fritz, Mainburg (DE); Michael Szelong, Freising (DE); Ernst Muellner, Munich (DE)

(73) Assignee: Texas Instmments Incorporated, Dallas, TX (US)

( * ) Notice: Subject to any disclaimer, the term of this patent is extended or adjusted under 35 U.S.C. 154(b) by 103 days.

(21) Appl. No.: 17/136,413

(22) Filed: Dec. 29, 2020

(65) Prior Publication Data

US 2021/0210473 A1     Jul. 8, 2021

Related U.S. Application Data

(60) Provisional application No. 62/983,794, filed on Mar. 2, 2020, provisional application No. 62/958,530, filed on Jan. 8, 2020.

(51) Int. Cl.
| | |
|---|---|
| *H01L 41/113* | (2006.01) |
| *H01L 27/20* | (2006.01) |
| *G01L 1/18* | (2006.01) |
| *H01L 41/311* | (2013.01) |
| *H01L 25/16* | (2023.01) |

(Continued)

(52) U.S. Cl.
CPC ............ *H01L 41/311* (2013.01); *G01L 1/18* (2013.01); *H01L 23/3107* (2013.01); *H01L 25/165* (2013.01); *H01L 27/20* (2013.01); *H01L 41/053* (2013.01); *H01L 41/1132* (2013.01)

(58) Field of Classification Search
CPC . H01L 41/311; H01L 23/3107; H01L 25/165; H01L 27/20; H01L 41/053; H01L 41/1132; G01L 1/18; G01L 1/2281; G01L 5/162; G01L 3/108
See application file for complete search history.

(56) References Cited

U.S. PATENT DOCUMENTS

| | | |
|---|---|---|
| 5,526,700 A | 6/1996 | Akeel |
| 2007/0151356 A1* | 7/2007 | Sumigawa ............ G01L 5/0047 |
| | | 73/777 |

(Continued)

FOREIGN PATENT DOCUMENTS

WO    WO-2018066557 A1 *   4/2018  ............... G01L 1/22

OTHER PUBLICATIONS

Search Report for PCT Patent Application No. PCT/US2021/012396, dated Apr. 22, 2021, 1 page.

*Primary Examiner* — David Vu
*Assistant Examiner* — Brandon C Fox
(74) *Attorney, Agent, or Firm* — Michael T. Gabrik; Frank D. Cimino

(57) ABSTRACT

An integrated circuit is described herein that includes a semiconductor substrate. First and second piezoresistive sensors are on or in the substrate where each have a respective sensing axis extending in first and second directions respectively parallel with a surface of the substrate, where the second direction is perpendicular to the first direction. A third piezoresistive sensor is on or in the substrate and has a respective sensing axis extending in a third direction parallel with the surface of the substrate and neither parallel nor perpendicular to the first and second directions.

26 Claims, 16 Drawing Sheets

(51) Int. Cl.
*H01L 23/31* (2006.01)
*H01L 41/053* (2006.01)

(56) References Cited

U.S. PATENT DOCUMENTS

| | | |
|---|---|---|
| 2014/0311249 A1 | 10/2014 | Yamada et al. |
| 2017/0123548 A1* | 5/2017 | Shih .......................... G01L 1/16 |
| 2017/0271057 A1* | 9/2017 | Pagani ..................... H01C 7/10 |
| 2017/0285864 A1* | 10/2017 | Pedder ................... G06F 3/045 |
| 2018/0372564 A1* | 12/2018 | Abbasi Gavarti .... G01L 1/2206 |
| 2022/0020915 A1* | 1/2022 | Nurmetov ................ G01L 1/16 |

* cited by examiner

INTEGRATED CIRCUIT STRESS SENSOR

CROSS-REFERENCE TO RELATED APPLICATIONS

This application claims the benefit of and priority to U.S. Provisional Patent Application Ser. No. 62/958,530 filed on Jan. 8, 2020 and to U.S. Provisional Patent Application Ser. No. 62/983,794 filed on Mar. 2, 2020, both of which are hereby fully incorporated herein by reference.

TECHNICAL FIELD

This relates generally to a torque sensor and more specifically, to an integrated circuit stress sensor.

BACKGROUND

Various types of torque sensors exist for measuring and recording torque on a rotating shaft. Many existing torque sensor systems are often costly and/or include components measure an effect from the shaft, such as electric, magnetic or optical effects, that result in systems becoming large and bulky. For example, a Hall-based magnetic system requires either a magnetized shaft or magnets attached to the shaft, which are prone to interference from magnetic fields. Optical systems are complex to build and often require a special housing. A micro-electromechanical system (MEMS) torque sensor uses piezoresistors externally attached to an integrated circuit (IC) chip to measure bending and/or torsion of a shaft. The MEMS torque sensor, however, requires an external standalone readout and signal conditioning circuit mounted to a printed circuit board, which creates a bulky system.

Other torque sensor systems include strain gauges that are attached to a rotating shaft of a structure. The strain gauge may include metal strips or wires that attach to the shaft via an adhesive. The torque sensor system also includes signal conditioning circuitry and a power supply mounted to the shaft. When the shaft is torqued, the strain gauges stretch and send signals to the signal conditioning circuitry. Thus, the strain gauge torque sensor system also is a bulky system requiring several separate components separated from each other mounted to the shaft.

SUMMARY

In one example, an integrated circuit is described that includes a semiconductor substrate. The integrated circuit includes a first strain-sensitive sensor on or in the substrate that has a first sensing axis extending in a first direction parallel with a surface of the substrate, and a second strain-sensitive sensor on or in the substrate that has a second sensing axis extending in a second direction parallel with the surface of the substrate and perpendicular to the first direction. A third strain-sensitive sensor is on or in the substrate and has a third sensing axis extending in a third direction parallel with the surface of the substrate and neither parallel nor perpendicular to the first and second directions.

In another example, a system is described that includes an integrated circuit (IC) including strain-sensitive sensors on or in a semiconductor substrate. The substrate has a crystal orientation and each of the strain-sensitive sensors have a respective sensing axis oriented at an angle relative to the crystal orientation of the substrate. The IC includes a sense circuit configured to determine a change in resistance for each of the respective strain-sensitive sensors responsive to deformation of the substrate. A communication device is coupled to the IC, where the communication device is configured to wirelessly communicate data representative of the deformation of the substrate responsive to the change in resistance. A controller is coupled to the IC and the communication device and is configured to control communication the communication device.

In still yet another example, an integrated circuit (IC) is described that includes strain-sensitive sensors on or in a semiconductor substrate, where the substrate has a crystal orientation. The strain-sensitive sensors include a first strain-sensitive sensor on or in the substrate to have a first sensing axis extending in a first direction parallel to a surface of the substrate and to the crystal orientation of the substrate. A second strain-sensitive sensor is on or in the substrate and has a second sensing axis extending in a second direction transverse to the crystal orientation of the substrate and parallel to the surface of the substrate, where the second direction is perpendicular to the first direction. A third strain-sensitive sensor is on or in the substrate and has a third sensing axis extending in a third direction parallel with the surface of the substrate that is neither parallel nor perpendicular to the first and second directions. A sense circuit is coupled to each of the first, second and third strain-sensitive sensors, the sense circuit is configured to provide respective sense signals, where the sense signals are representative of a change in resistance of the respective first, second, and third strain-sensitive sensors responsive to deformation of the substrate.

DETAILED DESCRIPTION

Described herein is an integrated circuit (IC) that includes strain-sensitive sensors that are configured to work in conjunction with a sense circuit to measure stress components (e.g., normal and shear) responsive to mechanical force applied to the IC. The IC is adapted to be coupled to a mechanical structure (e.g., shaft, beam, feather key, leadframe, etc.) to measure torque or other stress applied to the mechanical structure. Strain-sensitive sensors are formed on or in a surface of a substrate of the IC with respective sensing axes oriented in different directions with respect to a crystal orientation of the substrate. The strain-sensitive sensors thus may be configured to measure deformation in the substrate responsive to a mechanical force applied to or otherwise experienced by a mechanical structure to which the IC is coupled via an adhesive, clamp, metallic joint, cohesive joint, positive or non-positive fit joint. The strain-sensitive sensors may include circuit components or devices formed on or in the semiconductor substrate. Examples of strain-sensitive components are active and passive components including bipolar transistors, complementary metal oxide semiconductor (CMOS) transistors, metal lines, piezoresistors and the like. The strain-sensitive components are described in examples below mainly as piezoresistive sensors. However, other types of strain-sensitive components may be implemented in the ICs and SoCs described herein.

As a further example, the piezoresistive sensors are coupled to circuitry, which may be integrated in the IC with the sensors. For example, the piezoresistive sensors have respective resistances values that change responsive to the mechanical forces (e.g., shear and normal forces) experienced by the substrate. The circuitry thus can be configured to determine an indication of normal and shear forces based on the measured resistance values of the piezoresistive sensors. The resistance values of the respective piezoresistive sensors can also be used to correct the impact of the forces on associated circuitry in the IC. In an example, the IC includes a temperature sensor integrated into the substrate adjacent the piezoresistive sensors. The temperature sensor can provide a temperature signal representative of the substrate temperature. The circuitry may be configured to adjust the measured resistance values responsive to the temperature signal to reduce the temperature impact on the measured resistance values so as to also reduce the temperature impact on the determined indication of forces.

Figure 1A:
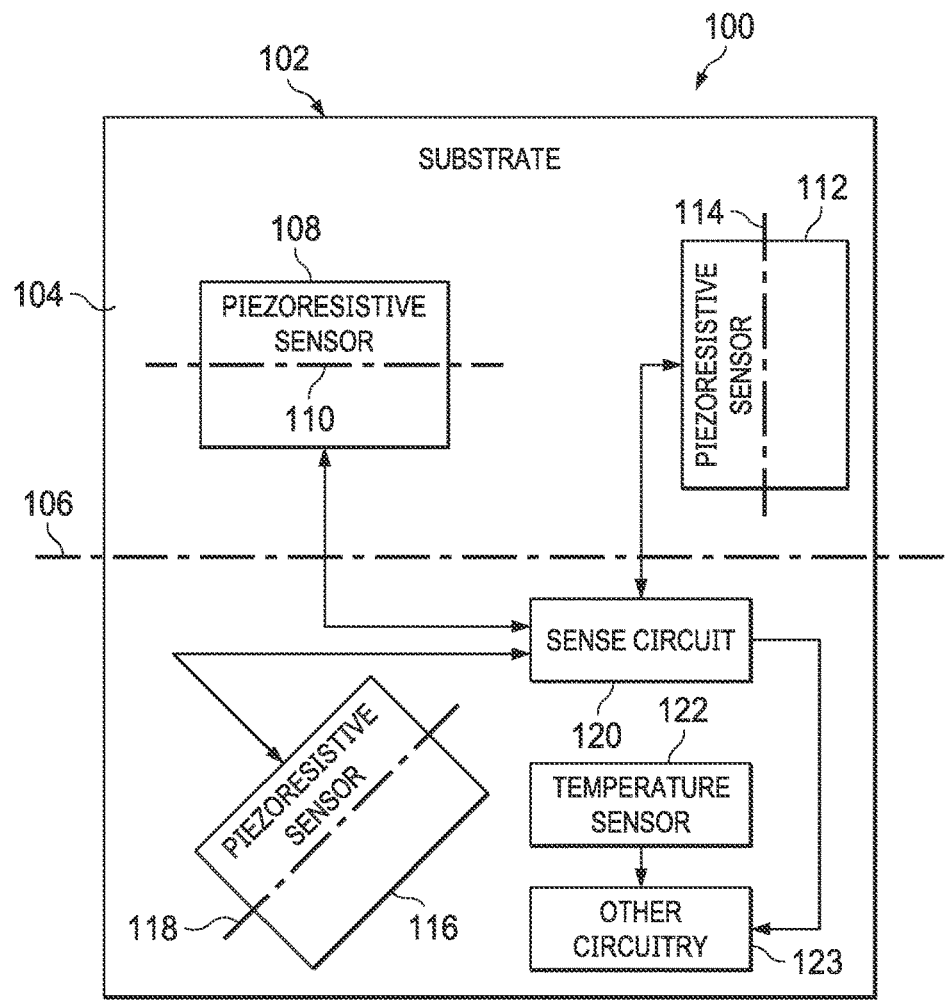
FIG. 1A is a block diagram of an example integrated circuit.

FIG. 1A is a block diagram of an integrated circuit (IC) 100. The IC 100 is adapted to couple to a mechanical structure (e.g., shaft, beam, feather key, leadframe, etc.). The IC 100 includes a substrate 102 having a contact surface and an opposing mounting surface 104. The contact surface of the IC is adapted to couple the IC 100 to the mechanical structure, such as by an adhesive, clamp, metallic joint, cohesive joint, positive fit, non-positive fit. The substrate 102 is made from a semiconductor material, such as silicon, germanium, gallium arsenide. The substrate has a crystal orientation (axis) that can extend in any direction (e.g., x-direction, y-direction, z-direction, or a combination thereof) based on the material and formation of the substrate 102. In the example of FIG. 1A, the crystal orientation of the substrate 102 is represented by a crystal (or central) axis 106 extending in the x-direction.

As an example, the substrate 102 is a semiconductor wafer formed from a single crystal rod such that the substrate surface is oriented relative to a crystallographic plane. Miller indices, indicated by curly brackets { }, are used to determine the respective plane in a cubic crystal. For example the substrate may be a p-type (or n-type) semiconductor substrate that is cut in the {100} plane.

The example IC 100 further includes piezoresistive sensors formed on or in the surface 104 of the substrate 102. For example, a first piezoresistive sensor 108 has a sensing axis 110 extending in a first direction parallel with the mounting surface 104 of the substrate 102 and parallel with the crystal axis (e.g., the [100] or another crystal axis). A second piezoresistive sensor 112 has a sensing axis 114 extending in a second direction parallel with the mounting surface 104 of the substrate 102 and perpendicular to the first direction of the first piezoresistive sensor 108. A third piezoresistive sensor 116 has a sensing axis 118 extending in a third direction parallel with the mounting surface 104 of the substrate 102 and that is neither parallel nor perpendicular to the first and second directions of the first and second piezoresistive sensors 108, 112 respectively. In an example, the sensing axis 118 may be oriented at an angle that is approximately half-way between the angle between the first and second directions of respective sensing axes 110 and 114 (e.g., about 45° from the axes 110 and 114). In another example, the sensing axis 118 of the third piezoresistive sensor 116 may be oriented at other angles (e.g., 15°, 30°, 60°, 75°, etc.) with respect to the respective sensing axes 110 and 114. The arrangement of the piezoresistive sensors 108, 112, 116 on or in the substrate 102 can be such that the orientations of the respective sensing axis can be parallel, perpendicular, or oriented at other angles (e.g., 15°, 30°, 60°, 75°, etc.) to the crystal axis of wafers cut in a different crystal plane (e.g., the [110] crystal, the [111] crystal).

The piezoresistive sensors 108, 112, 116 are coupled to a sense (readout) circuit 120. For example, each of the piezoresistive sensors 108, 112, 116 has input and output terminals coupled to respective outputs and inputs of the sense circuit 120. The sense circuit 120 is configured to measure a change in resistance of each of the respective piezoresistive sensors 108, 112, 116. The change in resistance is responsive to deformation of the substrate 102 from its normal (rest) condition, such as may be caused by mechanical force (e.g., compression, tension and/or shear forces) applied to the substrate 102. The sense circuit 120 provides output signals (sense signals) representative of longitudinal (e.g., compression and/or tension), normal and shear forces responsive to measured changes in the resistance of the respective piezoresistive sensors 108, 112, 116. As described herein, the particular forces being measured by each piezoresistive sensors 108, 112, 116 depends on the orientation of the sensing axis of respective piezoresistive sensors with respect the orientation of the crystal axis 106 of the substrate 102.

As a further example, the sensing axis 110 of the first piezoresistive sensor 108 is oriented parallel with the orientation of the crystal axis 106 of the substrate 102 (e.g., parallel to the [100] crystal axis). The sensing axis 114 of the second piezoresistive sensor 112 is oriented perpendicular with the orientation of the crystal axis 106 of the substrate 102 (e.g., perpendicular to the [100] crystal axis—or parallel to the [010] axis). In this configuration, the piezoresistive sensor 108 is configured so the change in resistance in the first and second piezoresistive sensors 108 is representative of longitudinal (e.g., compression and tension) forces responsive to the force applied to the substrate 102. The piezoresistive sensor 112 is configured so the change in resistance in the first and second piezoresistive sensors 108 is representative of normal forces responsive to the force applied to the substrate 102. Similarly, the sensing axis 118 of the third piezoresistive sensor 116 is oriented neither parallel nor perpendicular to the orientation of the crystal axis 106 (e.g., it is at angle of about ±45° relative to the [100] crystal axis). The third piezoresistive sensor 116 is thus configured such that the change in resistance in the third piezoresistive senor 116 corresponds to shear forces responsive to the force applied to the substrate 102.

To enable the sense circuit 120 to measure the longitudinal, normal and shear forces, as described above, the orientation of the crystal axis 106 of the substrate 102 is oriented either parallel (or transverse) to a longitudinal axis of the mechanical structure to which the IC 100 is mounted. Thus, to measure the longitudinal normal forces applied to the mechanical structure, the sensing axis 110, 114 of the first and second piezoresistive sensor 108, 112 are oriented parallel and perpendicular to the longitudinal axis of the mechanical structure respectively. To measure the shear force, the sensing axis 118 of the third piezoresistive sensor 116 is neither parallel nor perpendicular (e.g., at an angle of about ±45°) to the longitudinal axis of the mechanical structure.

Although, the first, second and, third piezoresistive sensors 108, 112, 116 are configured to exhibit a change in resistance to mechanical forces along their sensing axes, the piezoresistive sensors 108, 112, 116 also experience a resistance change due to other forces. For example, the resistance of the respective piezoresistive sensors 108, 112, 116 is also responsive to forces normal to their respective sensing axes. In an example, each of the piezoresistive sensors 108, 112, 116 is formed on or in the substrate 102 as a plurality of piezoresistor elements coupled in series between respective terminals. For example, each of the piezoresistive elements is implemented as a doped silicon resistor (e.g., P-type or N-type) depending on the doping of the semiconductor substrate. The plurality of piezoresistor elements includes a first (main) set of piezoresistor elements formed in the substrate having sensing axes parallel to a desired (main) sensing axis for the respective piezoresistive sensor. For example, the main sensing axis is determined based on the longitudinal direction of the piezoresistor element relative to the crystal axis of the semiconductor substrate. A second (e.g., compensation) set of one or more piezoresistor elements are formed in the substrate having sensing axes transverse to the desired (main) sensing axis for the respective piezoresistive sensor 108, 112, 116. The second set of piezoresistor element(s) in a respective piezoresistive sensor 108, 112, 116 is configured to provide a resistance that cancels out changes in resistance due to forces normal to the desired (main) sensing axis of the respective piezoresistive sensor.

As a further example, the resistance of the first and second piezoresistive sensors 108, 112 is also responsive to shear forces applied at angles that are neither longitudinal nor normal to the sensing axis of the respective. The change in resistance to the first and second piezoresistive sensors 108, 112 due to such shear forces can skew the measured resistance of the respective piezoresistive sensors by introducing a change in resistance responsive to the shear forces. This further can result in an inaccurate force being determined along the respective axes 110 and 114. To compensate for resistance variations due the shear forces and to correct the final value of the measured force, the measured shear force due to the change in resistance of the third piezoresistive sensor 116 is used to compensate for the shear force experienced by the first and second piezoresistive sensors 108, 112. In general, with four differently oriented resistors (as an example at an orientation with respect to the crystal axis of approximately 0°, 90°, +45°, −45°, respectively) one could correct the output of each of the sensors by the output of the other sensors for their inaccuracies if normal and shear stress are present at different directions at the same time.

As an example, the IC 100 includes other circuitry 123 implemented on the IC that includes a controller. The controller can be implemented as state machine, a processor core or microcontroller. The controller is configured to determine a value representative of longitudinal and normal force along axes 110, 114 responsive to the change of resistance for respective piezoresistive sensors 108, 112 (e.g., determined by sense circuit 120). The controller is also configured to determine a value representative of shear force along axis 118 responsive to the change of resistance for the sensors 116 (e.g., determined by sense circuit 120). In an example, controller is further configured to use the shear force value (due to the third piezoresistive sensor 116) to compensate for the shear forces experienced by the first and second piezoresistive sensors 108, 112. As a result, the final values of longitudinal and normal force determined by the controller responsive to a change in resistance of the respective first and second piezoresistive sensors 108, 112 may be provided to include only force components aligned with or along the respective sensor axes 110, 114.

Similarly, the third piezoresistive sensor 116 includes an arrangement of one or more piezoresistors having a resistance configured to change responsive to shear forces applied to the substrate 100 along the axis 118. The resistance of the third piezoresistive sensor 116, however, also changes responsive to longitudinal and normal forces applied to the substrate 100. The change in resistance of the third piezoresistive sensor 116 due to the longitudinal and normal forces can skew the measured resistance of the respective piezoresistive sensor 116 by introducing a change in its resistance responsive to the longitudinal and normal forces. The influence of the longitudinal and normal forces on the resistance of the piezoresistive sensor 116 can result in an inaccurate shear force being determined along the respective axis 118. The longitudinal and normal forces determined responsive to changes in resistance of the first and second piezoresistive sensors 108, 112 can be used to compensate for the longitudinal and normal forces experienced by the third piezoresistive sensor 116. For example, the controller is further configured to use the longitudinal and normal force values (from piezoresistive sensors 108, 112) to compensate for the longitudinal and normal forces experienced by the third piezoresistive sensor 116. As a result, in such example, the final value of the shear force determined by the controller responsive to a change in resistance of the third piezoresistive sensors 116 may be determined to include only the force component aligned with or along the respective sensor axis 118.

As a further example and still referring to the example of FIG. 1A, the IC 100 includes a temperature sensor 122 formed on or in the substrate surface 104. The temperature sensor has an output coupled to an input of the other circuitry 123, and is configured to provide a temperature signal representative of a temperature of the substrate 102. A change in temperature of the IC 100 and hence, the substrate 102 can affect resistance of the piezoresistors in each of the respective piezoresistive sensor 108, 112, 116, which may affect the resistance values determined by the sense circuit 120. Thus, the temperature of the substrate 102 is monitored and a change in substrate temperature is used by other circuitry to correct the normal and shear force values measured by the sense circuit 120. In addition, temperature compensation of a mismatch between thermal coefficients of expansion of the sensor substrate and the mechanical structure is also used to correct the normal and shear force values measured by the circuit 120.

The other circuitry 123 can also include an arrangement of components depending on the functionality of the IC 100. For example, the other circuitry includes inductors, capacitors, antennas, A/D converters, microcontrollers, etc. formed on the mounting surface 104 of the substrate 102, such as for implementing a system on chip (SoC). In an example, the SoC described herein is a multi-chip module (MCM). The MCM can include circuitry/components having different technologies/functions. For example, one or more ICs of the MCM includes strain-sensitive sensors and sensing circuitry/components configured to measure strain. Thus, the strain sensing IC can include analog circuitry and components. One or more other ICs of the MCM includes circuitry (e.g., microcontroller, state machine, processing core(s)) and components configured to perform processing and computing and related control functions. The ICs in the MCM can be coupled together through electrically conductive traces, wires or the like, such as to communicate data and instructions.

In another example, some of the circuitry 123 is be implemented on a circuit board to which the IC or SoC is coupled. The other circuitry 123 in the SoC (or MCM) may also be configured to establish a wired or wireless link (e.g., an inductive link, near field communications (NFC), Bluetooth, etc.) for power transfer from external circuitry to the IC 100. The other circuitry 123 further can be used to establish a wired or wireless communication channel for communicating data between the IC and a remote system. For example, the wireless link may utilize the wireless communication channel to calibrate the circuitry 120 or 123 and/or may to communicate sensor readout values to an external reader system.

Figure 1B:
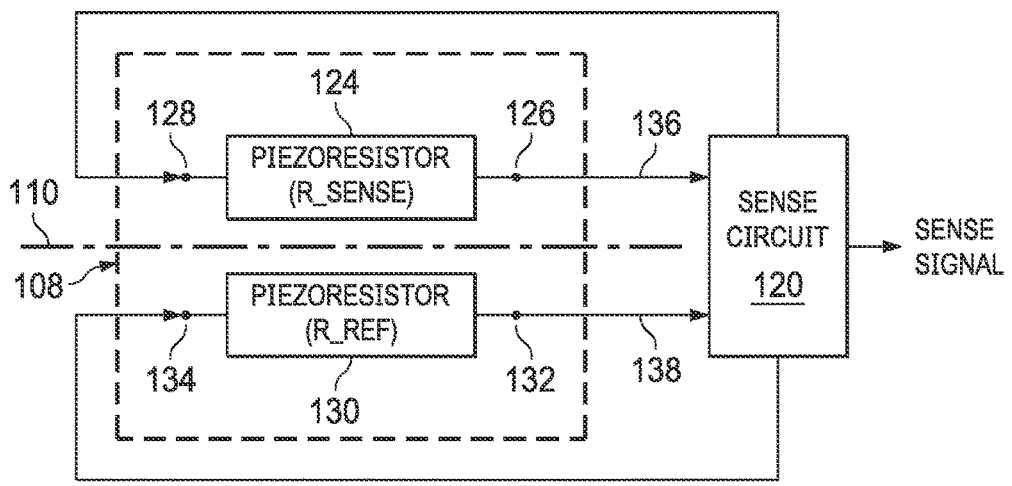
FIG. 1B is a block diagram of a sensing circuit from the IC of FIG. 1.

FIG. 1B is a block diagram of an example of resistance stress sensing circuitry that includes the piezoresistive sensor 108 and the sense circuit 120 of FIG. 1A. Accordingly, the description of FIG. 1B also refers to FIG. 1A. As shown in the example of FIG. 1B, the first piezoresistive sensor 108 includes a pair of piezoresistors 124 and 130. For example, the piezoresistor 124 includes terminals 126 and 128. The terminal 128 is coupled to an output of the sense circuit 120 and the terminal 126 is coupled to a first input of the sense circuit 120. The piezoresistor 130 includes terminals 132 and 134. The terminal 134 is coupled to an output of the sense circuit 120 and the terminal 132 is coupled to a second input of the sense circuit. As described herein, each of the piezoresistors 124 and 130 may include one or more piezoresistor elements coupled between respective terminals 126, 128 and 132, 134, in which the piezoresistor elements are formed in the substrate 102 to provide sensitivity to forces applied to substrate. For example, the sensitivity is along the sensing axis [110] or along another sensing axis. The output terminal 126 of the first piezoresistor 123 is coupled to a first input 136 of the sense circuit 120 and the output terminal 132 of the second piezoresistor 130 is coupled to a second input 138 of the sense circuit 120.

In the example of FIG. 1B, the piezoresistor 124 is sensing resistor configured to provide a variable resistance (R_SENSE) between terminals 126 and 128. For example, the resistance R_SENSE is variable responsive to longitudinal forces applied to the substrate along the axis 110. The piezoresistor 130 is a reference resistor configured to provide a fixed resistance (R_REF) between terminals 132 and 134. The sense circuit 120 is configured to provide first and second input signals (e.g., a DC input voltage) to the respective terminals 128 and 134. For example, the first and second input signals may be the same (e.g., where R_SENSE=R_REF) or the first and second input signals may be different (e.g., where R_SENSE≠R_REF). The inputs 136 and 138 of the sense circuit 120 receives output signals from the respective piezoresistors 124, 130 based on the input signals provided at 128 and 134. The sense circuit 120 is configured to provide the sense signal representative of a difference between the signals received at 134 and 136. Because the resistance R_REF of piezoresistor 130 remains fixed, the sense signal thus is representative of the change in resistance of the piezoresistor 124 responsive to force applied to the substrate 102. As another example, R_REF is dependent on stress differently as compared to R_SENSE. Thus, the sense signal (difference) is also representative of the change in stress. As described herein, the sense signal then can be used (e.g., by other circuitry 123) to determine stress components (e.g., longitudinal, normal and shear components) based on the change in resistance measured by the sense signal.

As a further example, the piezoresistor 124 is arranged in a lateral plane parallel to the mounting surface of the substrate 102. The piezoresistor 130 is formed in the substrate 102 having its sensitivity axis in a direction perpendicular to the lateral plane. Additionally, the reference piezoresistor 130 can be configured to have the same temperature dependency as the associated sensing piezoresistor 124 by forming the respective resistors to have substantially the same dopings. This configuration helps to ensure the sensing and reference piezoresistors 124 and 130 have the same temperature coefficients and respond to temperature changes in substantially the same way, which improves the accuracy in the change in resistance measured over temperature. In another example, different piezoresistors are combined in series where each has a different doping and different material to achieve a total temperature coefficient (TC) which is similar to the TC of R_SENSE and, at the same time, having a different stress coefficient. In this example, the TC cancels, but the stress does not. In still another example, R_REF has the same doping in silicon but has a different orientation (e.g., vertical instead of parallel to the surface).

Each of the second and third piezoresistive sensors 112, 116 may be configured similarly to the sensor 108 for sensing resistance (responsive to applied mechanical forces) along respective axes 114 and 118. Also, each of the second and third piezoresistive sensors 112, 116 can be coupled to a respective instance of the sense circuit 120 for generating sense signals representative of the change in resistance of the respective piezoresistive sensors 112, 116 responsive to force applied to the substrate 102.

Figure 2A:
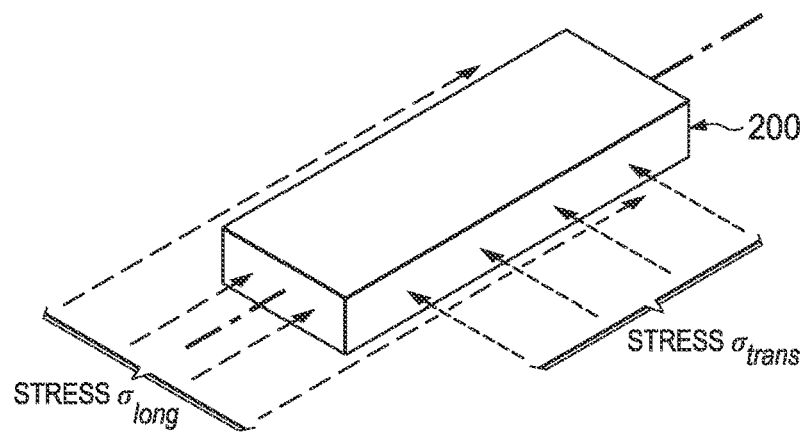
FIG. 2A depicts a piezoresistive sensor showing stress applied to the sensor from different directions.
Figure 2B:
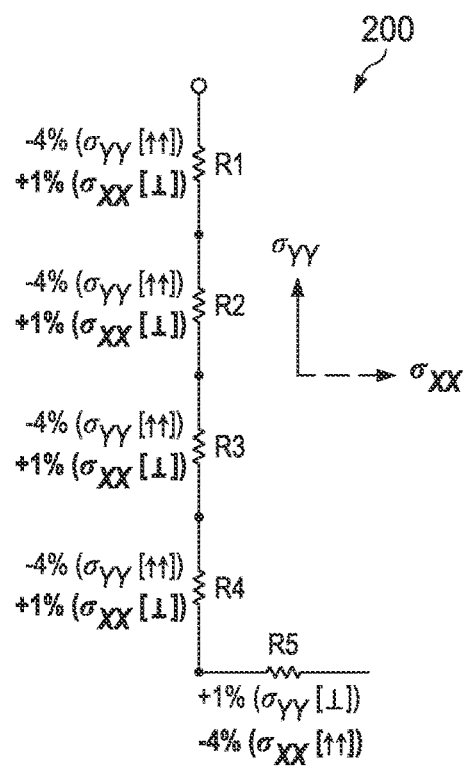
FIG. 2B is a resistor model showing series resistors responsive to stress applied to the sensors in FIG. 2A.

FIGS. 2A and 2B depict example of single piezoresistor 200 showing sensitivity to different mechanical stresses. The piezoresistor 200 is useful example of a piezoresistor (e.g., variable piezoresistor 124 of FIG. 1B) that may be implemented to form piezoresistive sensors 108, 112 and 116. In the example of FIGS. 2A and 2B, the forces experienced by the piezoresistor 200 are shown only as longitudinal and transverse (e.g., normal) stresses (in the x- and y-directions). The example single piezoresistor 200 includes resistor components shown as R1-R5. The five resistor elements R1-R5 are coupled together in series. As described herein, each of the resistors R1-R5 has a first sensitivity in a longitudinal direction and a second sensitivity in the transverse direction, in which the first sensitivity each of the resistor elements are formed on the substrate with axes of sensitivity oriented relative to the crystal axis so that the combined resistance of R1-R5 (e.g., shown as R_SENSE in FIG. 1B) is sensitive to only one direction of stress, namely the longitudinal direction. Each of the resistors R1-R4 are formed in the substrate to have a sensitivity axis parallel to the longitudinal axis. The resistor R5 is formed in the substrate to have a sensitivity axis transverse (normal) to the longitudinal axis. Thus, the piezoresistor 200 is a single-direction (e.g., uniaxial) sensing resistor formed in a semiconductor substrate with a sensing axis having a specific orientation relative to the crystal axis of the substrate.

In the example of FIGS. 2A and 2B, the piezoresistor 200 is a longitudinal stress sensor that provides a variable resistance that is responsive to only longitudinal stress (along) (in the y-direction). The piezoresistor 200 is internally configured to cancel the effects of transverse stress (σtrans). As an example, each resistor element R1-R4 of the piezoresistor 200 has a sensitivity to transverse stress (σtrans) that is approximately 1%/100 MPA, which totals 4%/100 MPA for the combination of R1-R4. The resistor element R5 of piezoresistor 200 has an individual sensitivity to transverse stress (σtrans) that is approximately negative 4%/100 MPa. For example, the equation below demonstrates the total sensitivity to transverse (normal) stress (σtrans) in the x-direction of 0%/100 MPa.

$$\frac{dR_{tot}}{R_0 d\sigma} = \frac{\frac{1}{5}(+1\% + 1\% + 1\% + 1\% - 4\%)}{100\text{ MPa}} = 0\%/100\text{ MPa}$$

Thus, the piezoresistor 200 has no sensitivity to transverse stresses in the x-direction.

As described, the piezoresistor 200 is configured to be sensitive to longitudinal stress (along) in the y-direction. R1-R4 are formed in the substrate to provide current flow through piezoresistor elements in a direction extending along or parallel to the y-direction (e.g., the longitudinal sensing axis). In the example of FIG. 2B, the piezoresistor 200 has a net sensitivity of −3%/100 MPa in the longitudinal direction. For example, each resistor element R1-R4 has an individual sensitivity of about negative 4%/100 MPA to longitudinal stress (along) in the y-direction. Additionally, the resistor element R5 of piezoresistor 200 has an individual sensitivity to longitudinal stress (along) that is approximately positive 1%/100 MPa. For example, the equation below demonstrates the total sensitivity to longitudinal (normal) stress (along) in the y-direction of approximately −3%/100 MPa.

$$\frac{dR_{tot}}{R_0 d\sigma} = \frac{\frac{1}{5}(-4\% - 4\% - 4\% - 4\% + 1\%)}{100\text{ MPa}} = -3\%/100\text{ MPa}$$

Therefore, the overall sensitivity of the example piezoresistor 200 to longitudinal stress is approximately −3%/100 MPa.

In this example, in order to cancel stresses in the x-direction so that the piezoresistor 200 is a y-normal stress sensor, the ratio of resistor components in the y-direction to the x-direction is 4:1. The ratio however, can change (e.g., 1.5:1, 2:1, 3:1, 5:1, etc.) based on the type of crystal substrate, the dimensions of the respective resistor element the mounting orientation of the IC package, the type of application, etc. Also, in other examples, different numbers of resistor elements may be used to form the piezoresistor 200.

Figure 3:
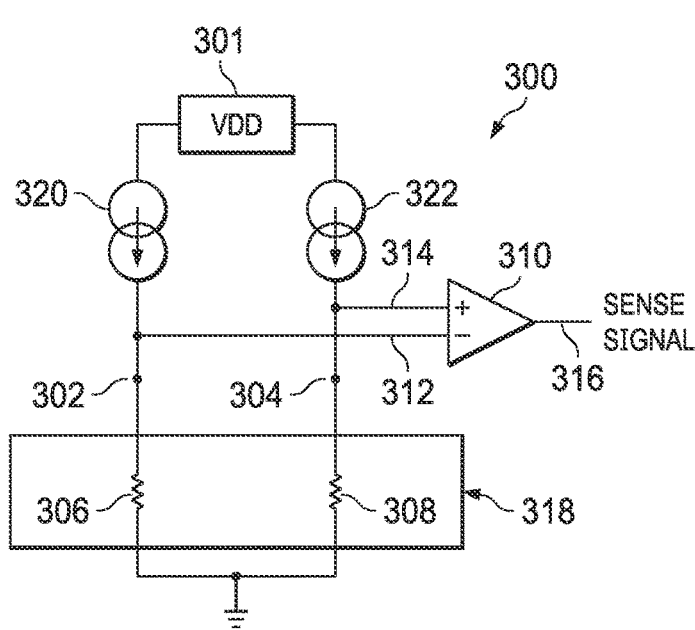
FIG. 3 is an example readout circuit for sensing normal stress from a pair of piezoresistive sensors.

FIG. 3 is an example of a stress sensing circuit 300 for an IC having a piezoresistive sensor configured to be responsive to normal or longitudinal stress, such as due to force applied parallel or normal to the crystal axis of the substrate. The circuit 300 includes a voltage source 301 having outputs coupled to respective terminals 302 and 304 of first and second piezoresistors 306, 308. Each of the piezoresistors 306, 308 has another terminal coupled to electrical ground. An amplifier (e.g., an operational amplifier) 310 has first and second inputs 312 and 314 and an output 316. The first input 312 is coupled to the inputs 302 of piezoresistor 306, and the second input 314 is coupled to the inputs 304 of piezoresistor 308. The piezoresistors 306, 308 form a piezoresistive sensor, such as to implement piezoresistive sensors 110 and 112 in the IC 100 of FIG. 1.

As an example, the voltage source 301 is configured to provide a DC voltage (VDD) that provides constant current, shown as 320 and 322, to each of the piezoresistors 306, 308. The current through the piezoresistors 306, 308 thus provides a voltage across each piezoresistor 306, 308 that varies based on its resistance. The amplifier 310 is configured to provide a sense signal at the output 316 representative of a difference between the voltage at inputs 302 and 304. For example, one of the piezoresistors 308 is configured as described with respect to FIGS. 2A and 2B to have a highest sensitivity to stress in the longitudinal direction. The other piezoresistor 306 has a fixed resistance (no stress dependency). As described herein, both piezoresistors 306, 308 have the same temperature dependence. The sense circuit 300 thus outputs a sense signal (a voltage signal) that is representative of a difference in resistance between the first and second piezoresistors 306, 308. In an example, the sense signal at 316 is proportional to longitudinal stress applied to the piezoresistive sensor 318, which includes piezoresistors 306, 308.

Figure 4:
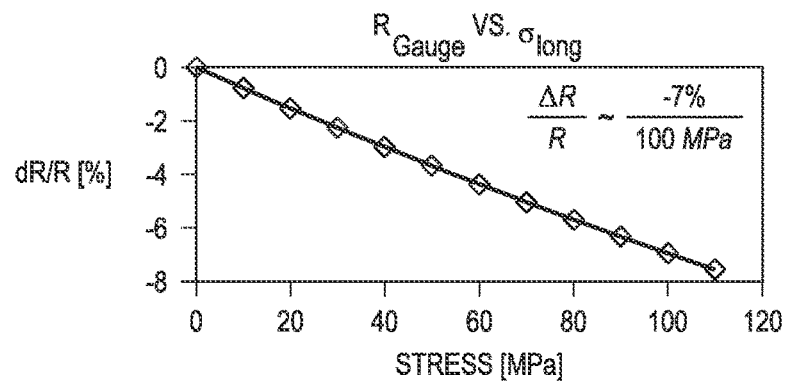
FIG. 4 is an example graph of resistance versus stress, such as provided by the readout circuit of FIG. 3.

FIG. 4 is a graph showing a change in the resistance value of the piezoresistors 312, 314 as the stress ($\sigma_{long}$) increases from 0 MPa to 100 MPa. For example, the difference in resistance of the piezoresistors 312, 314 changes by approximately −7% as the force increases from 0 MPa to 100 MPa. As shown in FIG. 4, in this example the change in resistance is inversely linearly proportional to longitudinal stress. In other examples, the change in resistance may also be directly proportional based on the sign of the longitudinal and transverse stress coefficients (see FIG. 2B), which in turn depends on the type of material, type of doping, etc. As described above, the sense circuit 300 outputs the voltage that is proportional to the change in resistance responsive to longitudinal stress.

Figure 5:
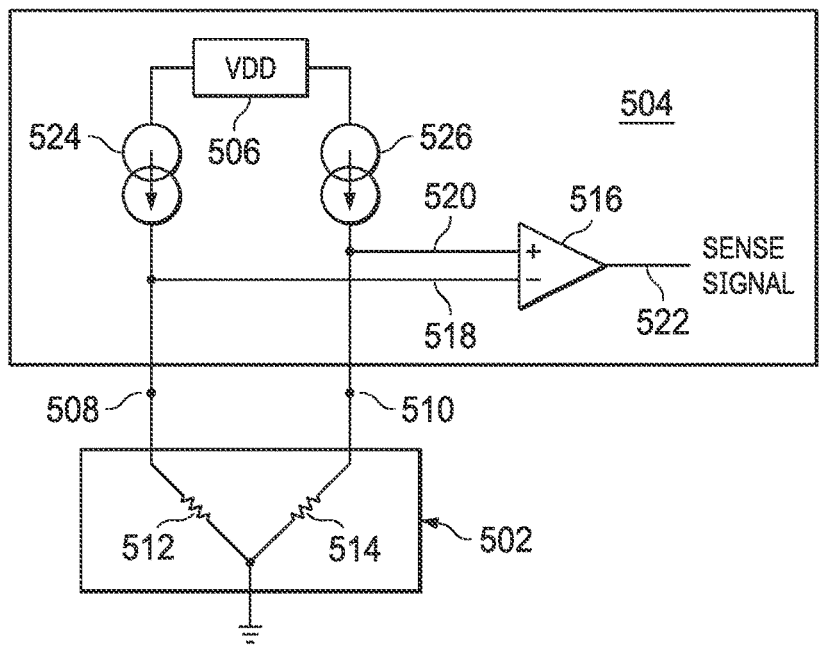
FIG. 5 is another example readout circuit for sensing shear stress from a pair of piezoresistive sensors.

FIG. 5 is an example of another stress sensing circuit 500 for an IC having piezoresistive sensor 502 configured to be responsive to shear stress ($\sigma_{shear}$) due to components of mechanical force applied parallel to the crystal axis of the substrate. The circuit 500 is the same as the circuit 300 except for the orientation of respective resistor elements (e.g., doped silicon resistors) in the piezoresistive sensor 502. The circuit 500 includes a sense circuitry 504 including a voltage source 506 having outputs coupled to respective terminals 508 and 510 of first and second piezoresistors 512, 514 of the piezoresistive sensor 502. Each of the piezoresistors 512, 514 has another terminal coupled to electrical ground. An amplifier 516 has first and second inputs 518 and 520 coupled to respective inputs 508 and 510. Amplifier 516 also includes an output 522.

Similar to as described with respect to FIG. 3, the voltage source 506 is configured to provide a DC voltage (VDD) that provides constant current, shown as 524 and 526, to each of the piezoresistors 512, 514. The current through the piezoresistors 512, 514 thus causes a voltage across each piezoresistor 512, 514 that varies proportional to its resistance. Unlike the example of FIG. 3, each of the piezoresistors 512 and 514 is formed in the substrate with a highest sensitivity to shear stress. For example, piezoresistor 512 has an axis of highest sensitivity oriented at approximately −45 degrees relative to the crystal axis and piezoresistor 514 has an axis of highest sensitivity oriented at approximately +45 degrees relative to the crystal axis. Thus, in this example, the piezoresistors 512 and 514 are oriented with orthogonal axes of highest sensitivity (90 degrees apart).

The amplifier 516 is configured to provide a sense signal at the output 522 representative of a change in resistance between piezoresistors 512, 514. The amplifier 516 of the sense circuit 504 thus outputs a sense signal (a voltage signal) that is representative of a difference in resistance between the first and second piezoresistors 512, 514. In an example, the sense signal at 522 is proportional to shear stress applied to substrate of the IC implementing the piezoresistive sensor 502.

Figure 6:
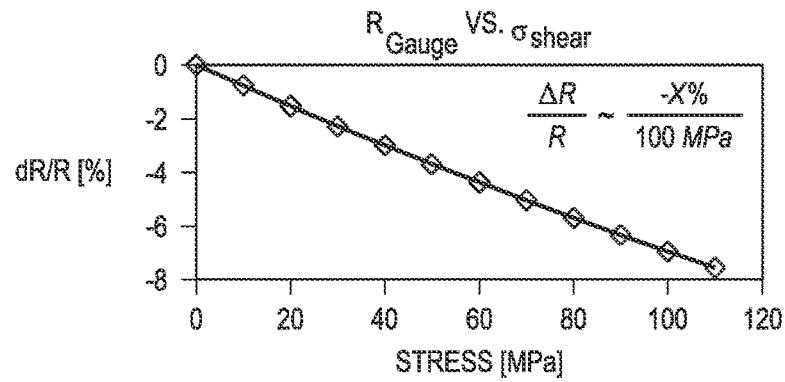
FIG. 6 is an example graph of resistance versus stress, such as provided by the readout circuit of FIG. 5.

FIG. 6 is a graph showing a change in the resistance value of the piezoresistors 512, 514 as the stress ($\sigma_{shear}$) increases from 0 MPa to 110 MPa. For example, the difference in resistance of the piezoresistors 512, 514 changes by approximately −X as the force increases from 0 MPa to 100 MPa. As shown in FIG. 6, in this example the change in resistance is inversely linearly proportional to shear stress. In other examples, the change in resistance may also be directly proportional based on the sign of the longitudinal and transverse stress coefficients (see FIG. 2B), which in turn depends on the type of material, type of doping, etc. As described above, the sense circuit 500 outputs the voltage that is proportional to the change in resistance responsive to shear stress.

Figure 7:
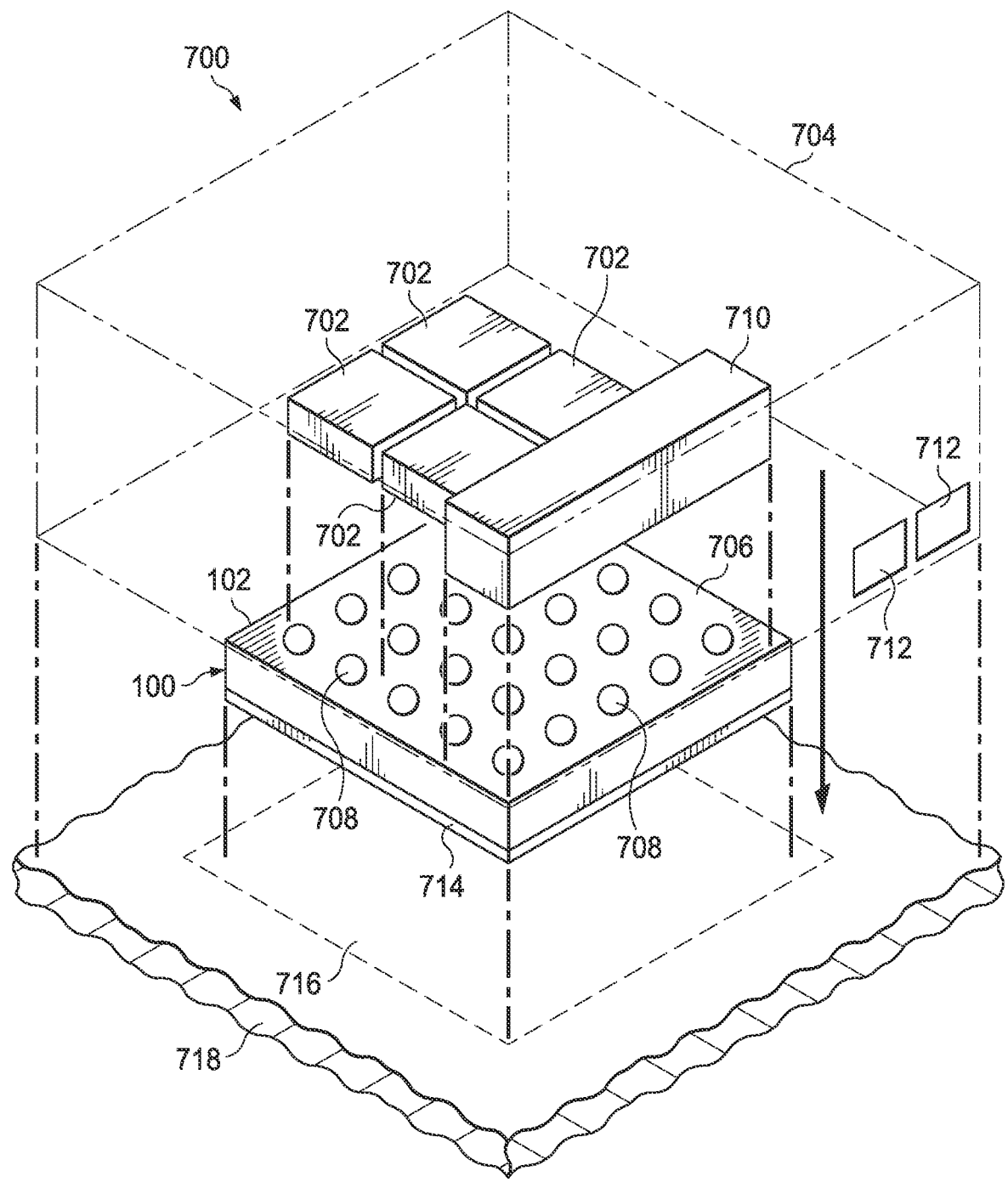
FIG. 7 is an exploded view of an example system on chip circuit implementing a torque sensor.
Figure 8:
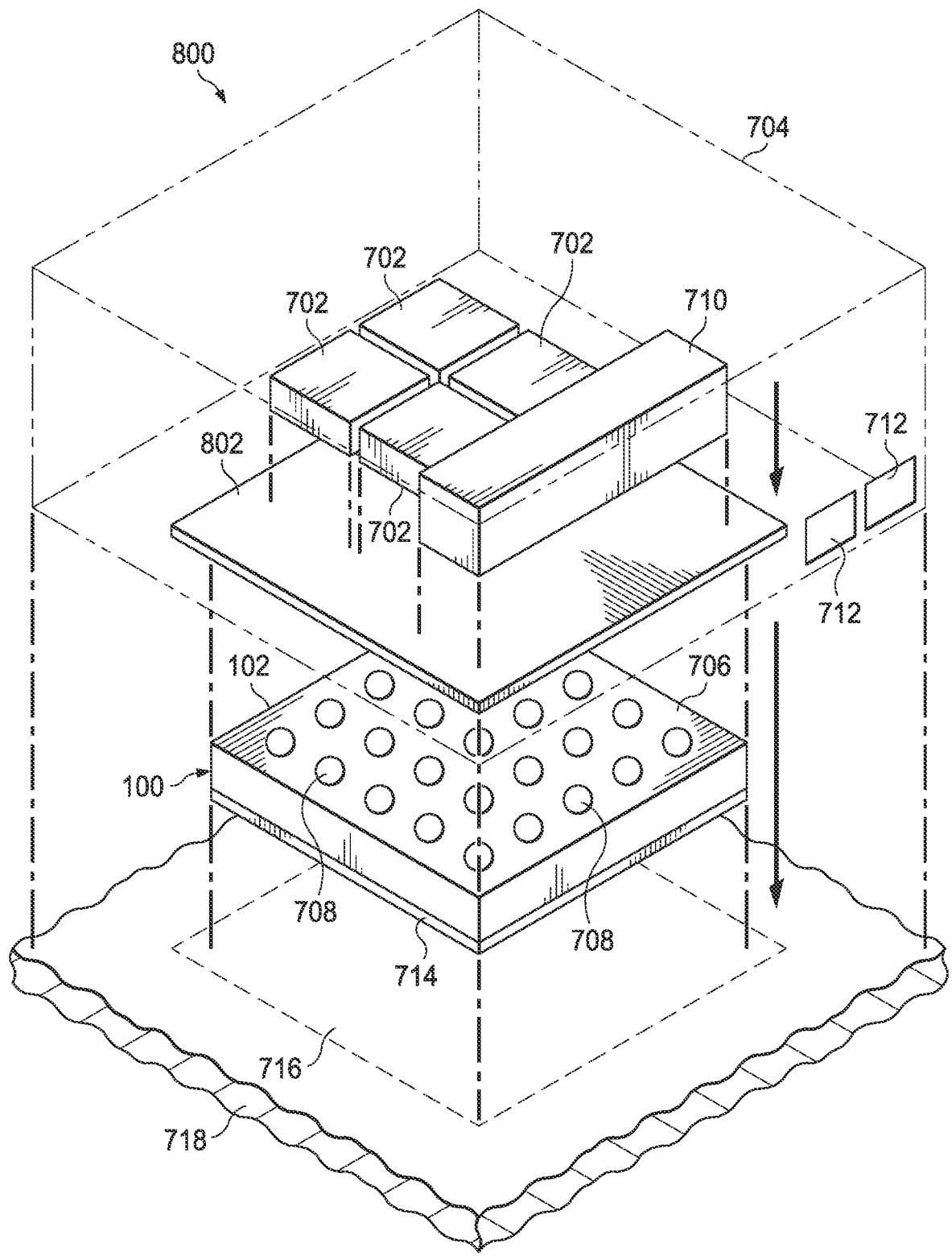
FIG. 8 is an exploded view of another example system on chip circuit implementing a torque sensor.

FIGS. 7 and 8 show examples of SoCs 700, 800 that may be implemented using the IC 100 to provide respective stress sensing systems. The SoC is adapted to be coupled to mechanical structure to measure mechanical stress of the structure, including normal stress (in one or more directions) and shear stress. As described herein, the IC includes a substrate 102 having integrated with piezoresistive sensors (e.g., sensors 108, 112, 116) formed on or in a substrate surface. The piezoresistive sensors are configured to change resistance responsive to a force applied to the IC 100. The IC 100 also includes circuitry (e.g., sense circuit 120) configured to measure a change in resistance that is representative of (e.g., proportional to) stress components (e.g., normal and/or shear stress). In another example, the SoC 700, 800 is implemented as a multi-chip module (MCM) that includes multiple ICs (including one or more instance of the IC 100) configured to perform respective functions, as described herein.

In the example of FIG. 7, the SoC 700 includes other components and/or circuitry 702 coupled to the IC 100. The SoC 700 includes a packaging material (e.g., epoxy molding compound, magnetic molding compound, polyimide, metal, plastic, glass, ceramic, etc.) 704 that encapsulates the IC 100 and the components/circuitry 702 mounted therein. The other components and/or circuitry 702 can include inductors, capacitors, antennas, A/D converters, microcontrollers, and the like. The other components and/or circuitry 702 is either integrated into the substrate 102 and part of the IC or mounted to a mounting surface 706 of the substrate 102 via interconnects (e.g., solder bumps) 708. In the example of FIG. 7, an antenna 710 is shown as being mounted to the mounting surface 706 of the substrate 102. Alternatively, the antenna 710 can be an external antenna. For example, the SoC 700 can include one or more pins 712 configured to couple such external (or other external components) to the substrate 102. Thus, the other components/circuitry can be either inside the package 700 or outside connected through a set of pins coupled to the internal circuitry and/or components. The pins 712 can provide communication (e.g., signal readout, analog/digital signals, sensor signals, etc.) to and from external components. The SoC 700 can include a coupling layer (e.g., metal layer, such as including a leadframe). 714 attached to a contact surface (surface opposite that of the mounting surface 706) of the IC for the purpose of attaching the SoC 700 to a respective surface 716 of a mechanical structure 718. Alternatively, the coupling layer 714 can be omitted and the contact surface of the substrate 102 can mount directly to the prepared surface 716 of the mechanical structure 718.

FIG. 8 is another example of an SoC 800 that includes the IC 100 having a monolithic, single crystal substrate 102, as described above. The SoC 800 include similar components of the SoC 700 of FIG. 7. Thus, the description of FIG. 8 also refers to FIG. 7. The SoC 800 further includes an interposer layer (e.g., printed circuit board (PCB)) 802 mounted on the mounting surface 706 of the substrate 102 via the interconnects 708. The other components/circuitry 702 and antenna 710 are mounted to the interposer (PCB) 802 and coupled to the substrate 102 through interconnects formed in the interposer 802. In another example, the other components/circuitry 702 and the antenna 710 along with the interposer 802 can be an additional PCB board with its own function, integrated into one package.

Figure 9:
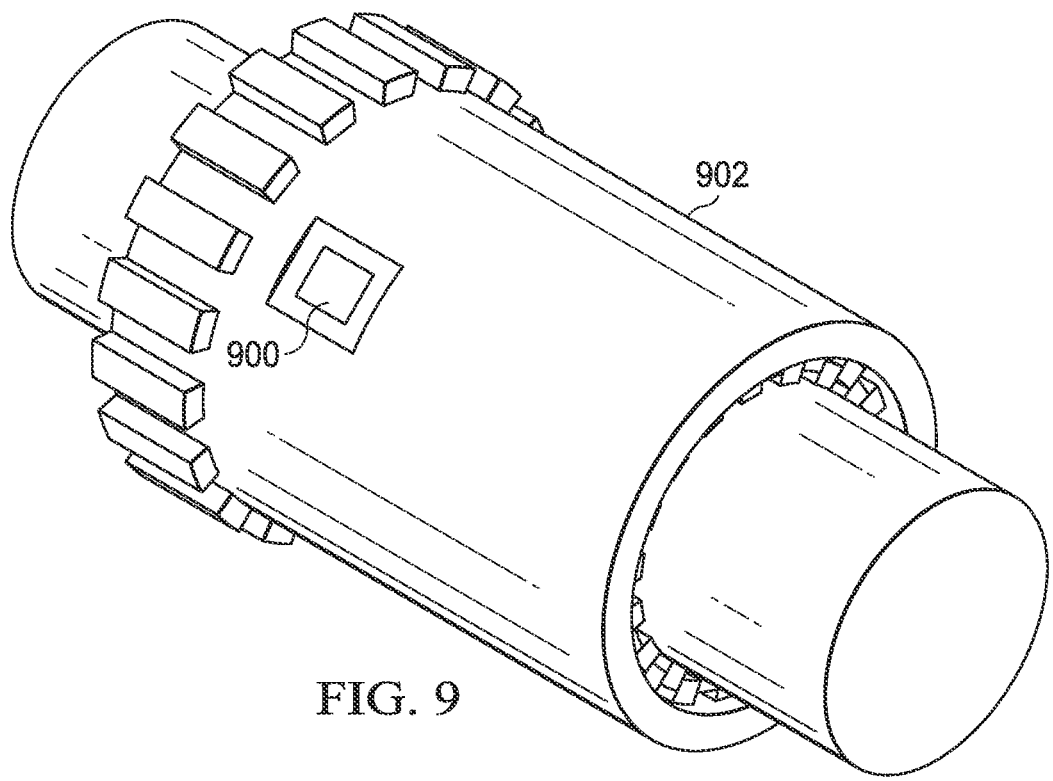
FIG. 9 is a perspective view of an example torque sensor system mounted on a surface of a mechanical structure.
Figure 14:
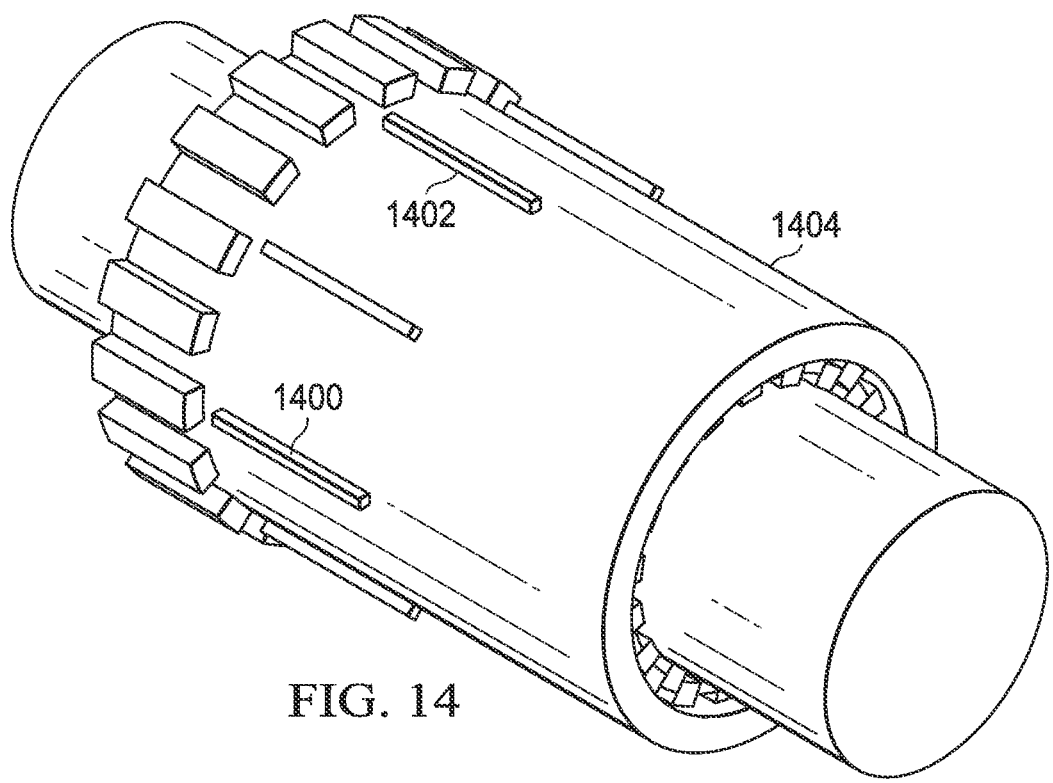
FIG. 14 is a perspective view of an example torque sensor system mounted perpendicular to a surface of a mechanical structure.

As a further example, FIGS. 9-13 illustrate an example mounting orientation for an SoC 900. The SoC 900 may be implemented by SoC 700, 800, which includes the IC 100, as described above. FIG. 9 illustrates the SoC 900 mounted to a surface of a mechanical structure (e.g., a shaft, beam, feather key or the like) 902. In an example, more than one SoC may be mounted to the mechanical structure 902. Alternatively, as described herein, the IC 100 itself may be used as the SoC and mounted directly to the mechanical structure 902. The SoC or IC may be coupled to the mechanical structure 902 through an adhesive, clamp, metallic joint, feather key.

FIGS. 10-13 illustrate the orientation of an example SoC 900 (or IC 100) having an arrangement of piezoresistive sensors when coupled to a mechanical structure to measure the mechanical stress of the mechanical structure, as described herein. In the examples of FIGS. 10-13, the piezoresistive sensors implemented on the IC 100 each has a sensing axis having a respective orientation relative to the crystal axis of the semiconductor substrate 102. In another example, the arrangement of the piezoresistive sensors can be implemented on the IC 100 so that the respective sensing axis of the piezoresistive sensors are oriented relative to the crystal axis of wafers cut in different respective crystal planes (e.g., cut in the [100], [110], [111] or other crystal plane). Thus, depending on the orientation of the crystal axis of the substrate, the IC 100 and SoC 900 can be coupled to the mechanical structure at an orientation to align the highest sensitivity axes of respective piezoresistive sensors with the force components to be measured on the mechanical structure 902. For example, each of the normal and shear piezoresistive sensors would be aligned so as to measure longitudinal, normal and shear forces applied to or experienced by the mechanical structure. An aligned marking may be printed on the IC 100 or SoC such as to show the direction of longitudinal sensing (e.g., parallel with the crystal axis of the substrate 102). In another example, the SoC 900 is implemented as an MCM that includes multiple ICs (including one or more instances of the IC 100) configured to perform respective functions, such as described herein.

Figure 10:
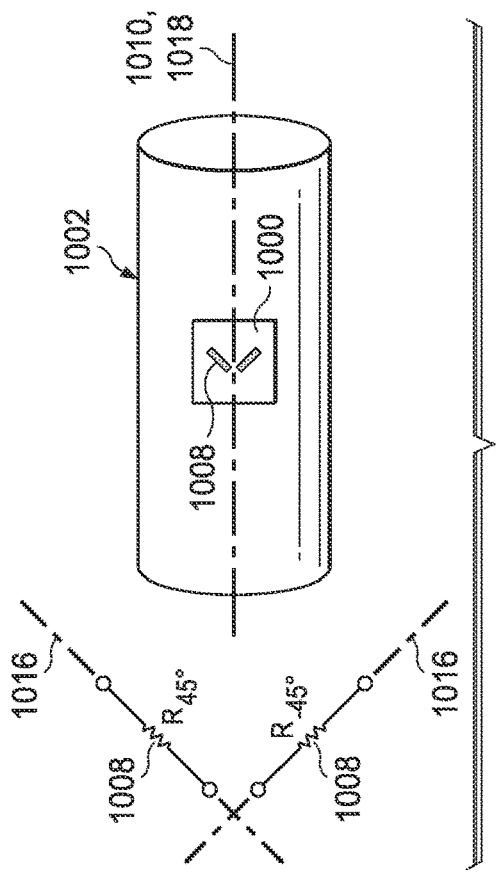
FIGS. 10-13 depict schematic views of piezoresistive sensors oriented at different sensing angles for sensing stress by the example torque sensor system of FIG. 5.
Figure 11:
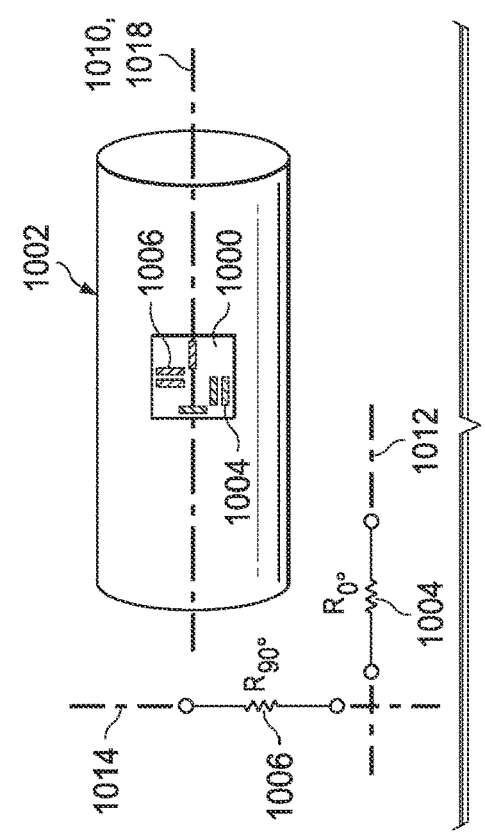

FIGS. 10 and 11 illustrate an example IC (or SoC) 1000 coupled to a surface of a mechanical structure 1002. In the example of FIGS. 10 and 11, the IC 1000 includes piezoresistive sensors 1004, 1006 and 1008 formed on a [100] semiconductor substrate having crystal axis extending through the IC shown at 1010. For example, the piezoresistive sensors 1004, 1006 and 1008 may be implemented by piezoresistive sensors 108, 112, 116, each including a respective pair of piezoresistors, as described herein.

FIG. 10 shows the orientation of normal piezoresistive sensors 1004 and 1006 having respective longitudinal sensing axes 1012 and 1014 in the x-direction and y-direction, respectively. For example, piezoresistive sensor (having a variable resistance $R_{0°}$) 1004 is an x-normal stress sensor having its longitudinal sensing axis oriented parallel with respect to the x-direction parallel to the axis 1010. The other normal piezoresistive sensor (having a variable resistance $R_{90°}$) 1006 is an y-normal stress sensor having its longitudinal sensing axis oriented parallel with respect to the y-direction perpendicular to the axis 1010.

FIG. 11 separately shows piezoresistive sensor 1008 as including two piezoresistors, shown as $R_{45°}$, $R_{-45°}$. The piezoresistive sensor 1008 is a shear stress sensor having a sensing axis 1016 oriented neither parallel nor perpendicular with respect to the axis 1010. In an example, the piezoresistive sensor 1008 includes piezoresistors, shown as $R_{45°}$, $R_{-45°}$, which are oriented at approximately +45° and -45° relative to the axis 1010 (in the x-direction) of the substrate of the IC 1000.

In the example of FIGS. 10 and 11, the axis 1010 of the substrate of the IC 1000 is parallel with a longitudinal axis 1018 of the mechanical structure 1002. Therefore, the sensing axis 1012 of the piezoresistor 1004 is parallel with a longitudinal axis 1018 of the mechanical structure 1002 and the sensing axis 1014 of the piezoresistor 1006 is perpendicular with the longitudinal axis 1018 of the mechanical structure 1002. Additionally, the sensing axes 1016 of the piezoresistive sensor 1008 are oriented at ±45° relative to the longitudinal axis 1018 of the mechanical structure 1002. The piezoresistors 1004, 1006, which have sensing axes 1012, 1014 parallel and perpendicular, respectively, to the longitudinal axis 1018 of the mechanical structure 1002, are configured to measure normal forces along the surface of the mechanical structure. The piezoresistive sensor 1008 is configured to measure shear forces along the surface of the mechanical structure.

Figure 12:
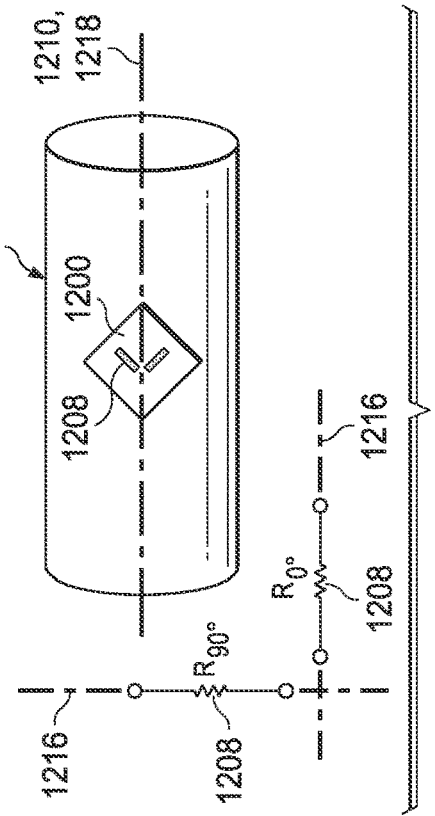
Figure 13:
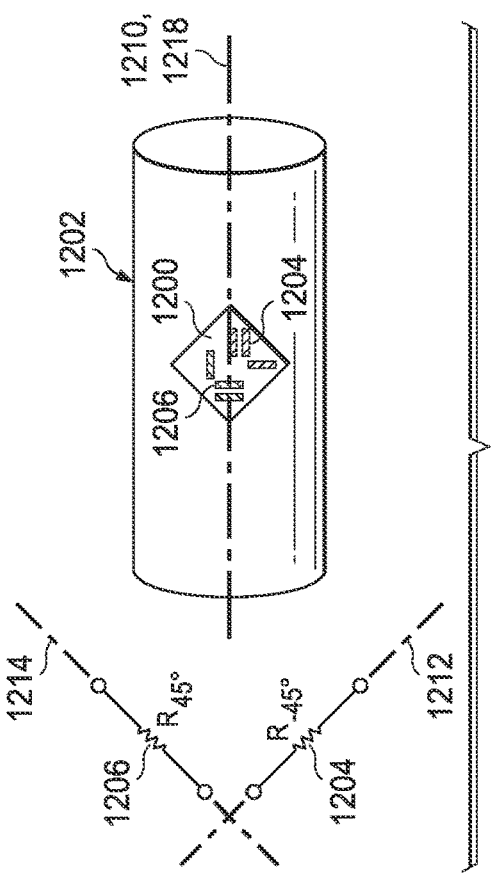

FIGS. 12 and 13 illustrate an example IC (or SoC) 1200 coupled to a surface of a mechanical structure 1202. In the example of FIGS. 12 and 13, the IC 1200 includes piezoresistive sensors 1204, 1206 and 1208 formed on a [110] semiconductor substrate having a [100] crystal axis extending through the IC 1200 shown at 1210. For example, the piezoresistive sensors 1204, 1206 and 1208 may be implemented by piezoresistive sensors 108, 112, 116, each including a respective pair of piezoresistors, as described herein.

FIG. 12 shows the orientation of normal piezoresistive sensors 1204 and 1206 having respective longitudinal sensing axes 1212 and 1214 that are offset from the substrate orientation (substrate axis) 1210 by approximately 45°, as shown. For example, piezoresistive sensor (having a variable resistance $R_{-45°}$) 1204 has its longitudinal sensing axis 1212 oriented at -45° relative to the substrate orientation and along [100] of the substrate and parallel to the axis 1210. Thus, the piezoresistive sensor 1204 is configured to sensing stress in a direction that is parallel to an axis 1218 of the mechanical structure 1202. The other normal piezoresistive sensor (having a variable resistance $R_{45°}$) 1206 is a y-normal stress sensor having its longitudinal sensing axis 1214 oriented at +45° relative to the crystal axis and along [010] of the crystal and perpendicular to the axis 1210. The piezoresistive sensor 1206 is thus configured to sensing normal stress in a direction that is perpendicular to the axis 1218 mechanical structure.

FIG. 13 separately shows piezoresistive sensor 1208 as including two piezoresistors, shown as $R_{90°}$, $R_{0°}$. The piezoresistive sensor 1208 is a shear stress sensor having its resistors oriented parallel and perpendicular with respect to the substrate orientation and +/-45° with respect to the axis 1210. In an example, the piezoresistive sensor 1208 includes piezoresistors, shown as $R_{0°}$, $R_{90°}$, which are oriented at approximately 45° and -45° relative to the axis 1210, namely along [110] and [-110] of the substrate of IC 1200.

In the example of FIGS. 12 and 13, the axis 1210 of the substrate for the sensors 1204, 1206 is aligned parallel with a longitudinal axis 1218 of the mechanical structure 1202 by rotating the IC 1200 by 45°, as shown (compared to FIGS. 10 and 11). The rotation of the IC 1200 results in the sensing axis 1212 of the piezoresistor 1204 being parallel with the longitudinal axis 1218 of the mechanical structure 1202 and the sensing axis 1214 of the piezoresistor 1206 being perpendicular with the longitudinal axis 1218 of the mechanical structure 1202. Additionally, a sensing axes 1216 of the piezoresistive sensor 1208 are oriented at ±45° relative to the longitudinal axis 1218 of the mechanical structure 1202. The piezoresistors 1204, 1206 thus are configured to measure normal forces along the surface of the mechanical structure. The piezoresistive sensor 1208 is configured to measure shear forces along the surface of the mechanical structure 1202.

FIGS. 14-18 illustrate another example mounting orientation for a SoC 1400. The SoC 1400 may be implemented according to the example SoCs 700, 800 of FIGS. 7 and 8, as described above, each of which includes the IC 100. FIG.

14 illustrates the SoC 1400 mounted in a cutout or slit 1402 perpendicular to a surface of a mechanical structure 1404 (e.g., a shaft, beam or the like). In another examples, the SoC 1400 is mounted on a sidewall of a carrier material (e.g. on the side of a feather key structure), which can be mounted in a keyway or indentation.

FIGS. 14-18 illustrate orientations of the SoCs and respective piezoresistive sensors with respect to the mechanical structure to measure longitudinal, normal and shear mechanical forces. As described herein, the piezoresistive sensors implemented on the IC 100 each has a sensing axis having a respective orientation relative to the crystal axis of the semiconductor substrate 102. Thus, depending on the orientation of the crystal axis of the substrate, the IC 100 and SoC 1400 should be coupled to the mechanical structure 1404 at an orientation to align the highest sensitivity axes of respective piezoresistive sensors with the force components to be measured on the mechanical structure 1404. For example, each of the normal and shear piezoresistive sensors would be aligned so as to measure longitudinal, normal and shear forces applied to or experienced by the mechanical structure 1404. An aligned marking may be printed on the IC 100 or SoC such as to show the direction of longitudinal sensing (e.g., parallel with the crystal axis of the substrate 102). In an example, the SoCs of FIGS. 14-18 are implemented as a MCMs that include multiple ICs (including one or more strain sensing IC) configured to perform respective functions, such as described herein.

Figure 15:
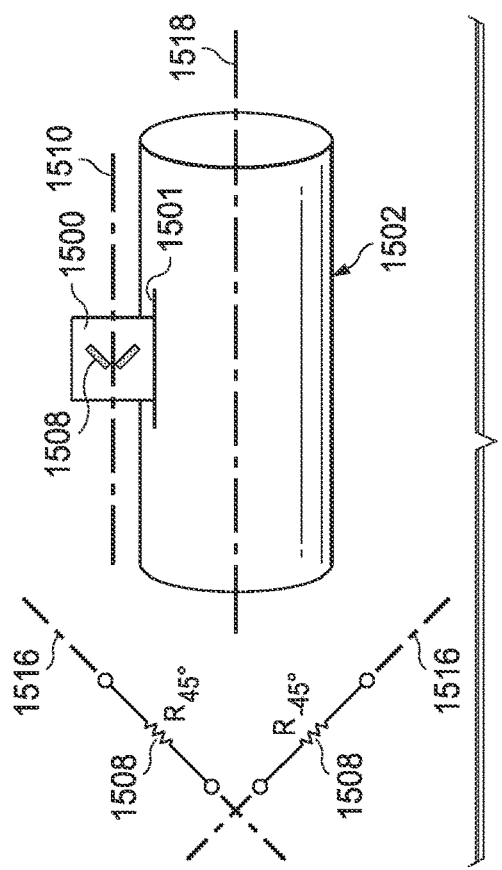
FIGS. 15-18 depict schematic views of piezoresistive sensors oriented at different sensing angles for sensing stress by the example torque sensor system of FIG. 10.
Figure 16:
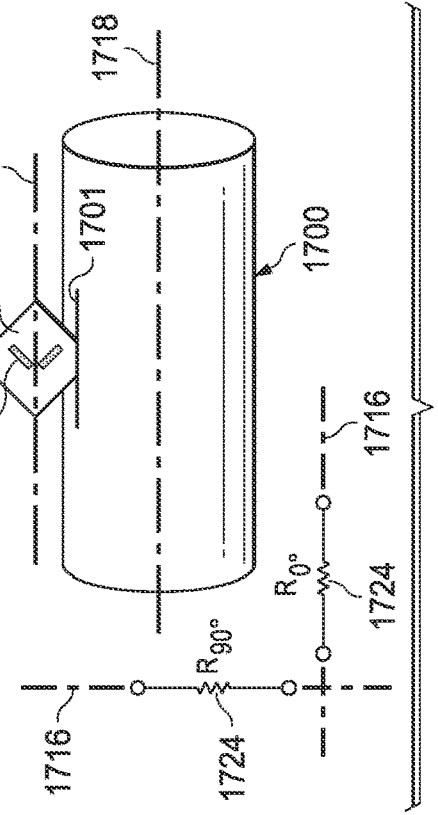

FIGS. 15 and 16 illustrate an example IC (or SoC) 1500 coupled to in a slot 1501 of a mechanical structure 1502. The IC 1500 includes piezoresistive sensors 1504, 1506 and 1508 formed on a [100] semiconductor substrate having crystal axis extending through the SoC shown at 1510. For example, the piezoresistive sensors 1504, 1506 and 1508 may be implemented by piezoresistive sensors 108, 112, 116, each including a respective pair of piezoresistors, as described herein.

FIG. 15 shows the orientation of normal piezoresistive sensors 1504 and 1506 having respective longitudinal sensing axes 1512 and 1514 in the x-direction and y-direction, respectively. For example, piezoresistive sensor (having a variable resistance $R_{0°}$) 1504 is an x-normal stress sensor having its longitudinal sensing axis oriented parallel with respect to the x-direction parallel to the axis 1510. The other normal piezoresistive sensor (having a variable resistance $R_{90°}$) 1506 is an y-normal stress sensor having its longitudinal sensing axis oriented parallel with respect to the y-direction perpendicular to the axis 1510.

FIG. 16 separately shows piezoresistive sensor 1508 as including two piezoresistors, shown as $R_{45°}$, $R_{-45°}$. The piezoresistive sensor 1508 is a shear stress sensor having a sensing axis 1516 oriented neither parallel nor perpendicular with respect to the axis 1510. In an example, the piezoresistive sensor 1508 includes piezoresistors, shown as $R_{45°}$, $R_{-45°}$, which are oriented at approximately +45° and −45° relative to the axis 1510 (in the x-direction) of the substrate of IC 1500.

Figure 17:
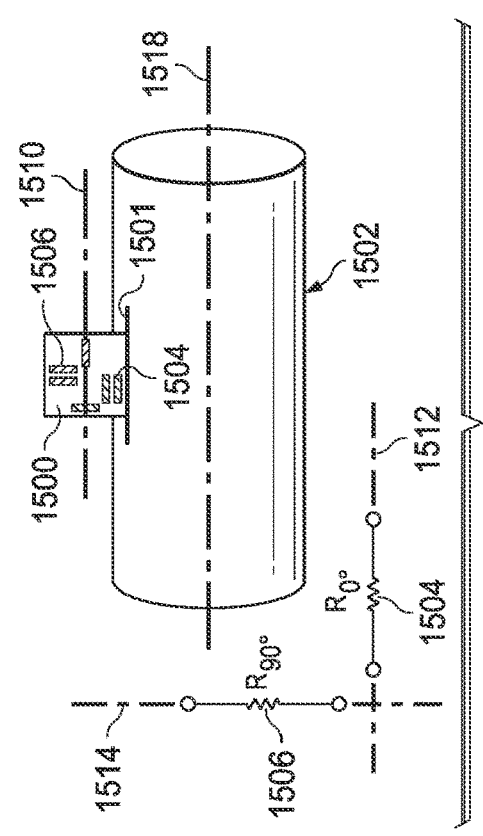
Figure 18:
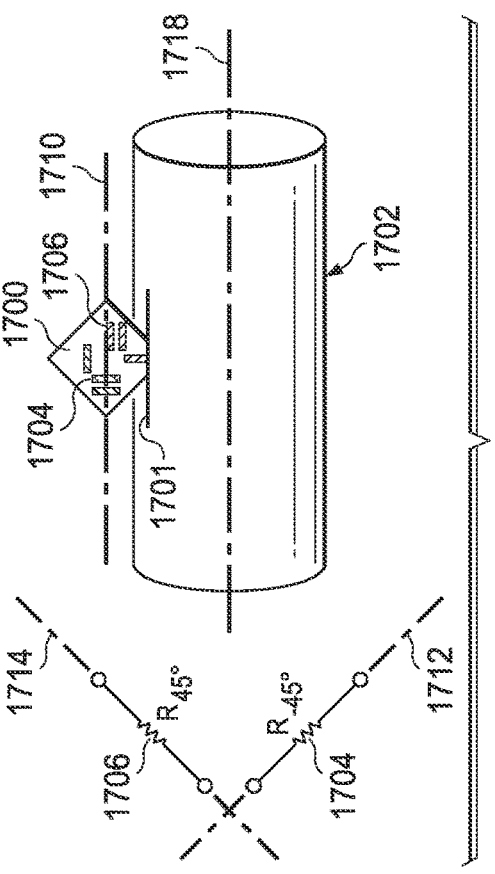

In the example of FIGS. 15 and 16, the axis 1510 of the substrate of IC 1500 is parallel with a longitudinal axis 1518 of the mechanical structure 1502. Therefore, the sensing axis 1512 of the piezoresistor 1504 is parallel with the longitudinal axis 1518 of the mechanical structure 1502 and the sensing axis 1514 of the piezoresistor 1506 is perpendicular with the longitudinal axis 1518 of the mechanical structure 1502. Additionally, the sensing axes 1016 of the piezoresistive sensor 1508 are oriented at ±45° relative to the longitudinal axis 1518 of the mechanical structure 1502. Thus, the piezoresistors 1504, 1506 are configured to measure normal forces and the piezoresistive sensor 1508 is configured to measure shear forces along the mechanical structure within the substrate. This translates to measuring torque and bending of the mechanical structure, respectively FIGS. 17 and 18 illustrate an example IC (SoC) 1700 coupled in a slot 1701 of a mechanical structure 1702. In the example of FIGS. 17 and 18, the IC 1700 includes piezoresistive sensors 1704, 1706 and 1708 formed on a [110] semiconductor substrate having a crystal axis extending through the IC 1700 shown at 1710. For example, the piezoresistive sensors 1704, 1706 and 1708 may be implemented by piezoresistive sensors 108, 112, 116, each including a respective pair of piezoresistors, as described herein.

FIG. 17 shows the orientation of normal piezoresistive sensors 1704 and 1706 having respective longitudinal sensing axes 1712 and 1714 that are offset from the substrate orientation 1710 by approximately 45°, as shown. For example, piezoresistive sensor (having a variable resistance $R_{-45°}$) 1704 has its longitudinal sensing axis 1712 oriented at −45° relative to the substrate orientation and along [100] of the crystal and parallel to the axis 1710. Thus, the piezoresistive sensor 1704 is configured to sense normal stress in the substrate which is representative for torque and/or bending in the mechanical structure 1702. The other normal piezoresistive sensor (having a variable resistance $R_{45°}$) 1706 is a y-normal stress sensor having its longitudinal sensing axis 1714 oriented at +45° relative to the substrate orientation (along [010] of the crystal) and perpendicular to the axis 1710. The piezoresistive sensor 1706 is thus configured to sensing normal stress in a direction that is perpendicular to the axis 1718 of the mechanical structure 1702.

FIG. 18 separately shows piezoresistive sensor 1708 as including two piezoresistors, shown as $R_{90°}$, $R_{0°}$. The piezoresistive sensor 1708 is a shear stress sensor having its resistors oriented parallel and perpendicular with respect to the substrate orientation and +/−45° with respect to the axis 1710. In an example, the piezoresistive sensor 1708 includes piezoresistors, shown as $R_{0°}$, $R_{90°}$, which are oriented at approximately 90° and 0° relative to the substrate orientation and +/−45° relative to the axis 1710, namely along [010] and [100] of the substrate of IC 1700.

In the example of FIGS. 17 and 18, the crystal axis 1710 on the substrate of IC 1700 is aligned parallel with a longitudinal axis 1718 of the mechanical structure 1702 by rotating the IC 1700 by 45°, as shown (compared to FIGS. 15 and 16). The rotation of the IC 1700 results in the sensing axis 1712 of the piezoresistor 1704 being parallel with the longitudinal axis 1718 of the mechanical structure 1702 and the sensing axis 1714 of the piezoresistor 1706 being perpendicular with the longitudinal axis 1718 of the mechanical structure 1702. Additionally, a sensing axes 1716 of the piezoresistive sensor 1708 are oriented at ±45° relative to the longitudinal axis 1718 of the mechanical structure 1702. The piezoresistors 1704, 1706 thus are configured to measure normal forces and the piezoresistive sensor 1708 is configured to measure shear forces along the mechanical structure 1702.

Figure 19:
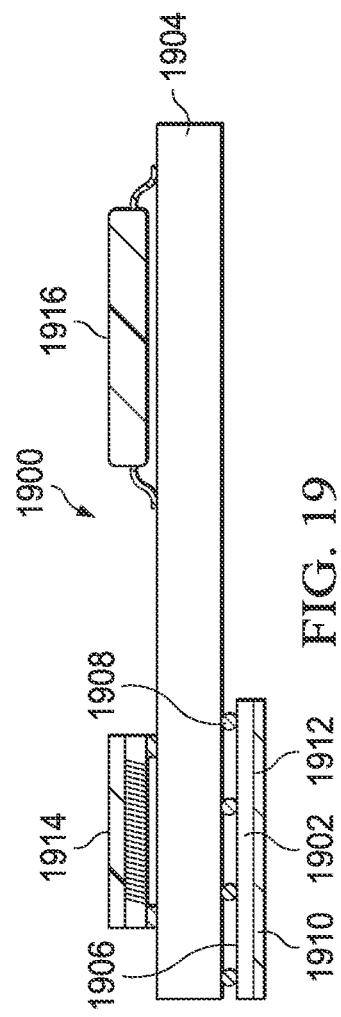
FIG. 19 is a cross section view of an example torque sensor system.

FIG. 19 illustrates an example stress sensing system 1900 that includes an IC 1902. In an example, the stress sensing system 1900 The IC 1902 includes a substrate and an arrangement of piezoresistive sensors, such as sensors 108, 112, 116 or otherwise described herein. The IC 1902 may be configured to measure stress along multiple directions, including normal stress along perpendicular sensing axes and shear stress. The stress sensing system 1900 thus may be referred to as a torque sensor system.

In the example of FIG. 19, the torque sensor system 1900 includes a printed circuit board (PCB) 1904 coupled to a mounting surface 1906 of the IC 1902 through interconnects (e.g., solder balls) 1908. The torque sensor system 1900 can include a coupling (metal) layer 1910 coupled to a contact surface 1912 of the IC 1902, in which the coupling layer 1910 is adapted to be coupled to a mechanical structure. Alternatively, the contact surface 1912 can be adapted to attach directly to the mechanical structure, such as by an adhesive, clamp, metallic joint, keyed joint. A communication device (e.g., transponder coil) 1914 is attached to an opposite side of the PCB 1904 and is configured to provide a wireless interface to transfer power and data between the IC 1902 and external electronic circuitry. The system 1900 may also include a microcontroller (e.g., one or more of microprocessor, digital signal processor, FPGA or the like) 1916 attached to the opposite side of the PCB 1904. For example, the microcontroller is configured to function as readout circuit to convert the measured change in resistance (from piezoresistive sensors) into respective stress and/or torque measurements. The microcontroller 1916 can also further process signals from the IC such as to implement additional temperature compensation or determine a condition of the mechanical structure to which the system 1900 is coupled. The microcontroller 1916 can also control the communication device 1914, such as to communicate sensor data between the IC 1902 and external circuitry through wires or through a wireless communication protocol (e.g., NFC, ZigBee, Bluetooth, etc.).

Figure 20:
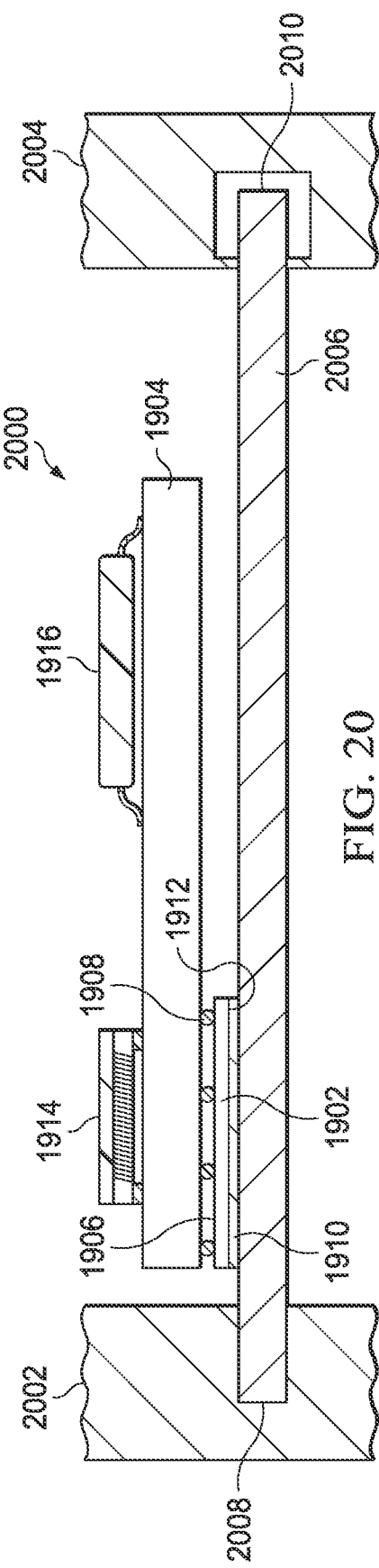
FIGS. 20 and 21 are cross-sectional views illustrating the example torque sensor system of FIG. 19 mounted to a mechanical structure for sensing normal stress applied to the structure.
Figure 21:
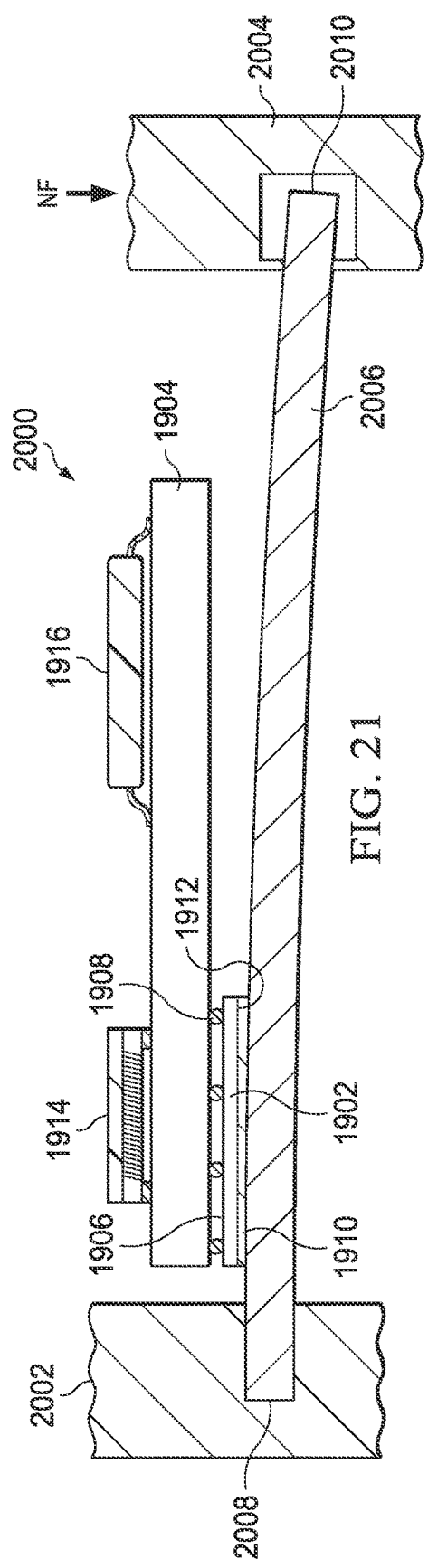

FIGS. 20 and 21 illustrate an example application of the torque sensor system 1900 of FIG. 19 coupled to a mechanical structure 2000. The mechanical structure 2000 includes a fixed support 2002 at one end, and a flexible support 2004 at an opposite end. In an alternative example, both ends of the mechanical structure 2000 are fixed. A metal beam cantilever 2006 has a fixed end 2008 secured in the fixed support 2002 and a movable end 2010 disposed in the flexible support 2004. Alternatively, the metal beam 2006 can be fixed along a side surface of the mechanical structure 2000. The torque sensor system 1900 is coupled to a surface of the metal beam cantilever 2006 through the coupling layer 1910, such as described herein. The IC 1902 is located on the cantilever surface adjacent the fixed end 2002 of the cantilever 2006. In an example, when a normal force NF is applied to the mechanical structure 2000, the movable end 2010 of the metal beam cantilever 2006 is deflected as shown in FIG. 21. The deflection causes the metal beam cantilever 2006 to bend thereby imparting stress on the contact surface of the IC 1902 of the torque sensor system 1900 responsive to the bending. As described above, the stress can be determined by measuring the change in resistance of the piezoresistors implemented on the IC 1902 of the torque sensor system 1900.

Figure 22:
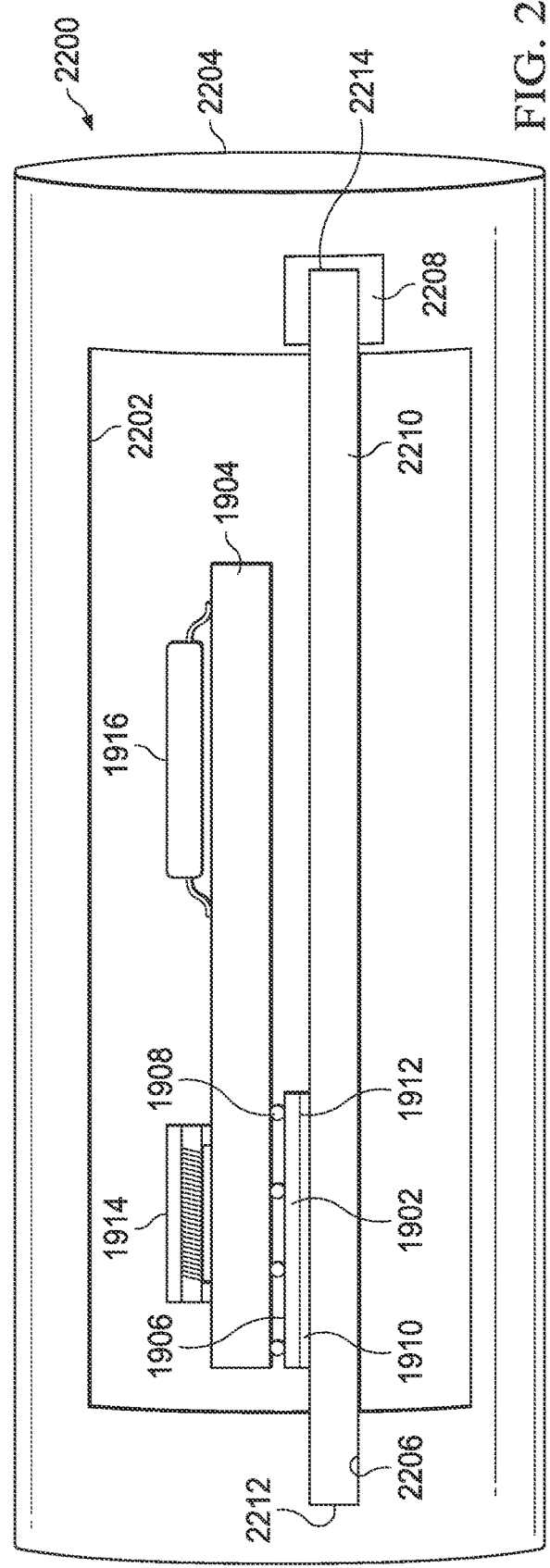
FIGS. 22 and 23 are cross-sectional views illustrating the example torque sensor system of FIG. 19 mounted to a mechanical structure for sensing torsional stress applied to the structure.
Figure 23:
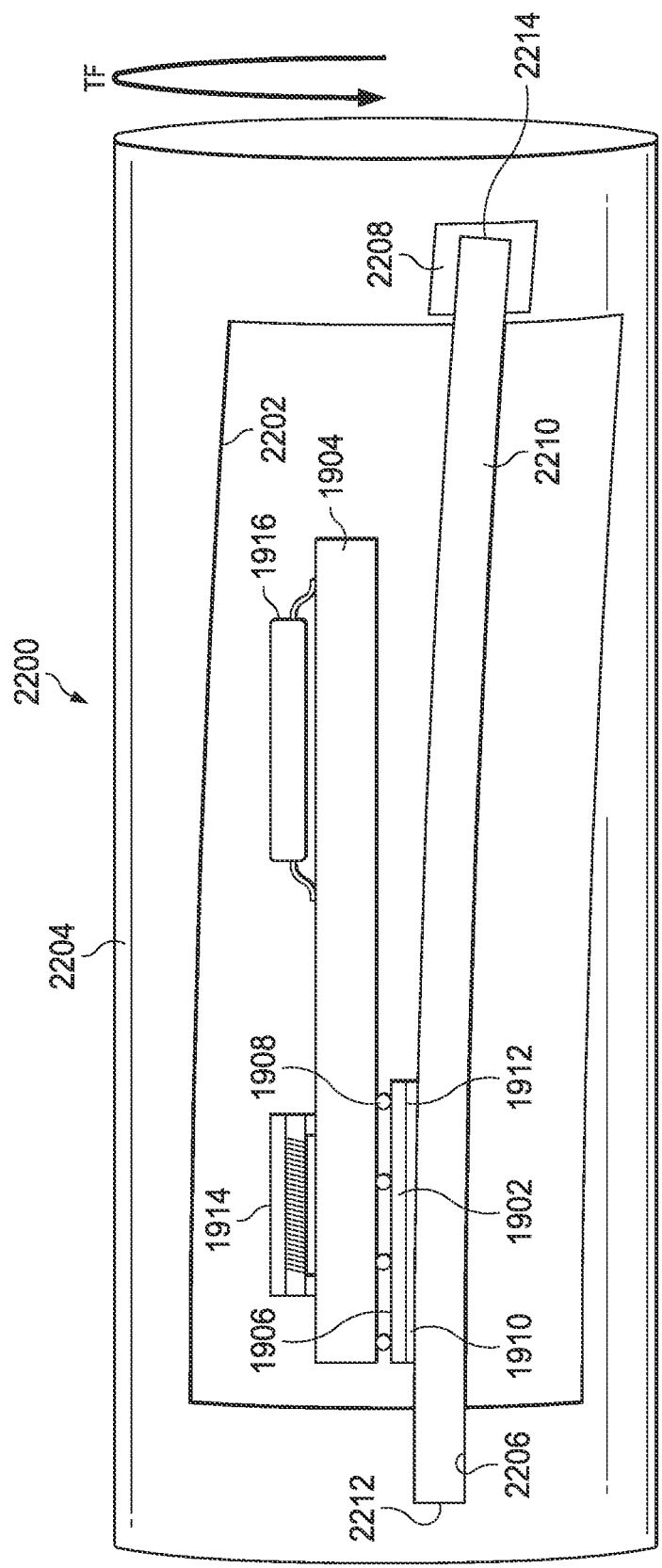
Figure 24:
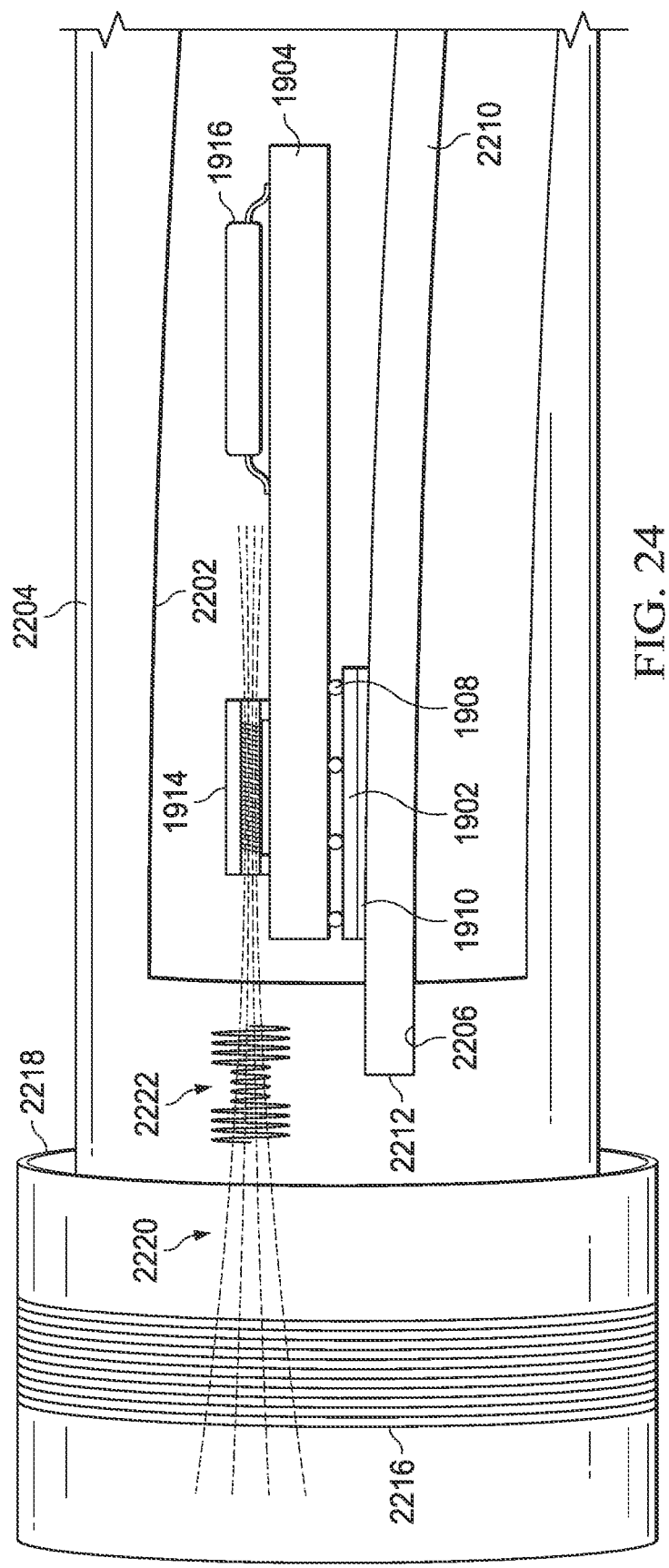
FIG. 24 depicts the torque sensor of FIG. 19 mounted to a shaft showing power supply and communications.

FIGS. 22, 23 and 24 illustrate another example application of the torque sensor system 1900 of FIG. 19 coupled to another mechanical structure 2200. As shown in FIGS. 22 and 23, the torque sensor system 1900 is mounted in a cut-out area 2202 of the mechanical structure 2200 and oriented to detect stresses along respective sensing axes (see, e.g., FIGS. 14-18). The mechanical structure 2200 includes a movable shaft 2204, a fixed support 2206 at one end, and a flexible support 2208 at an opposite end. A metal beam cantilever 2210 has a fixed end 2212 secured in the fixed support 2206 and another end 2214 disposed in the flexible support 2208 that is moveable responsive to applied torque to the shaft 2204. The torque sensor system 1900 is coupled to the metal beam cantilever 2210 via the coupling layer 1910. As shown in FIG. 23, when a torque force TF (see FIG. 23) is applied to the mechanical structure 2200, the torque force twists the shaft 2204 about its longitudinal axis. The installation of the sensor torque system 1900 to extend along a radial direction of the shaft 2204 (see, e.g., FIG. 14) translates the torque into respective stress components similar to the stress on the metal beam cantilever in the example of FIGS. 20 and 21. For example responsive to the torque force TF, the end 2214 of the metal beam cantilever 2008 deflects, which causes the metal beam cantilever 2008 to bend thereby inflicting stress on the surface of the IC substrate that is coupled to the cantilever. As described above, the stress can be determined by measuring the change in resistance of the piezoresistors implemented on the IC 1902 in the torque sensor system 1900.

FIG. 24 illustrates an example of wireless communication between the torque sensor system 1900 and external system. For example, a transmitter coil (e.g., antenna) 2216 is wound around a housing 2218 of the movable shaft 2204. The housing 2218 thus remains static, as compared to the movable shaft 2204, responsive to force applied to the movable shaft 2204 An electric field 2220 is generated by the communication device (e.g., transponder coil) 1914 transfers data signals 2222 to the transmitter coil 2216, which in turn communicates to the external reader systems. Additionally, external circuitry may be configured to provide a wireless power signal can be provided to the transmitter coil 2216 that is received by the communication device 1914. The received power signal can be harvested, such as by converting it to electrical energy for storage in a battery (or other energy storage element) implemented on the PCB 1904. Alternatively, the communication device (e.g., transponder coil) 1914 can be wound around the movable shaft 2204 and the transmitter coil 2216 can be placed on the shaft housing 2218. In still yet another configuration, the communication device (e.g., transponder coil) 1914 can be wound around the movable shaft 2204 and the transmitter coil 2216 can be wound around the shaft housing 2218. In addition, the wireless communication system can include multiple antennas (e.g. four transmitter antennas statically placed in 90° orientation to the shaft axis on the shaft housing and one transponder antenna freely rotating on the shaft or vice versa). Still further, there can be multiple transmitter and transponder antennas placed on the shaft inside the housing. The antennas do not need to be wound entirely around either shaft or shaft housing.

Figure 25:
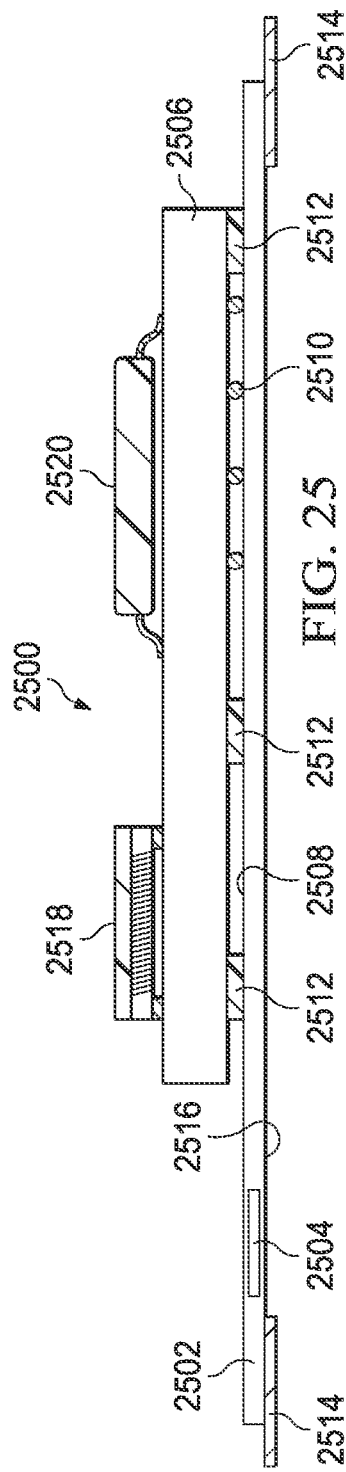
FIGS. 25 and 26 are cross-sectional and top views of another example torque sensor system.
Figure 26:
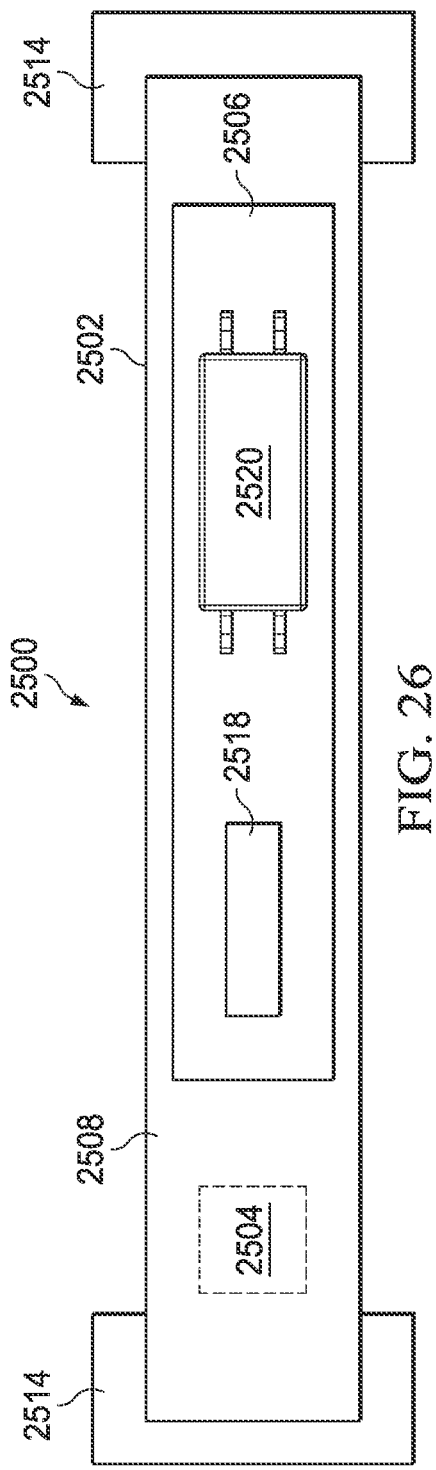

FIGS. 25 and 26 illustrate another example torque sensor system 2500 that includes an IC, such as the IC 100 described herein. The torque sensor system 2500 includes a substrate 2502 having a sensor area 2504, which includes an arrangement of piezoresistive sensors as described herein. In the example of FIGS. 25 and 26, the substrate 2502 (e.g., a monolithic, single crystal substrate) functions as the carrier (i.e., the metal beam in the above examples) in a mechanical structure. The system 2500 can also include a printed circuit board (PCB) 2506 attached to a mounting surface 2508 of the substrate 2502 through interconnects (e.g., solder balls) 2510. Polymer pillars 2512 are provided between the PCB 2506 and the substrate 2502 to maintain a uniform height of the PCB 2506 with respect to a surface of the substrate 2502. A coupling layer (e.g., lead-frame) 2514 is attached to a contact surface 2516 of the substrate 2502. The coupling layer 2514 couples the substrate 2502 to the mechanical structure. In the example of FIGS. 25 and 26, a communication device (e.g., transponder/power coil) 2518 is coupled to an opposite side of the PCB 2506 and provides an interface to transfer power and/or data between the system 2500 and external circuitry. A microcontroller 2520 may also be coupled to the opposite side of the PCB 2506. As described the microcontroller can be configured to function as a readout circuit, to further process sense signals, and/or control can communication between the system 2500 and external circuitry through a wireless protocol. In another example, some or all of the circuitry coupled to the PCB 2506 may be implemented in the IC or otherwise coupled to the IC in an SoC.

Figure 27:
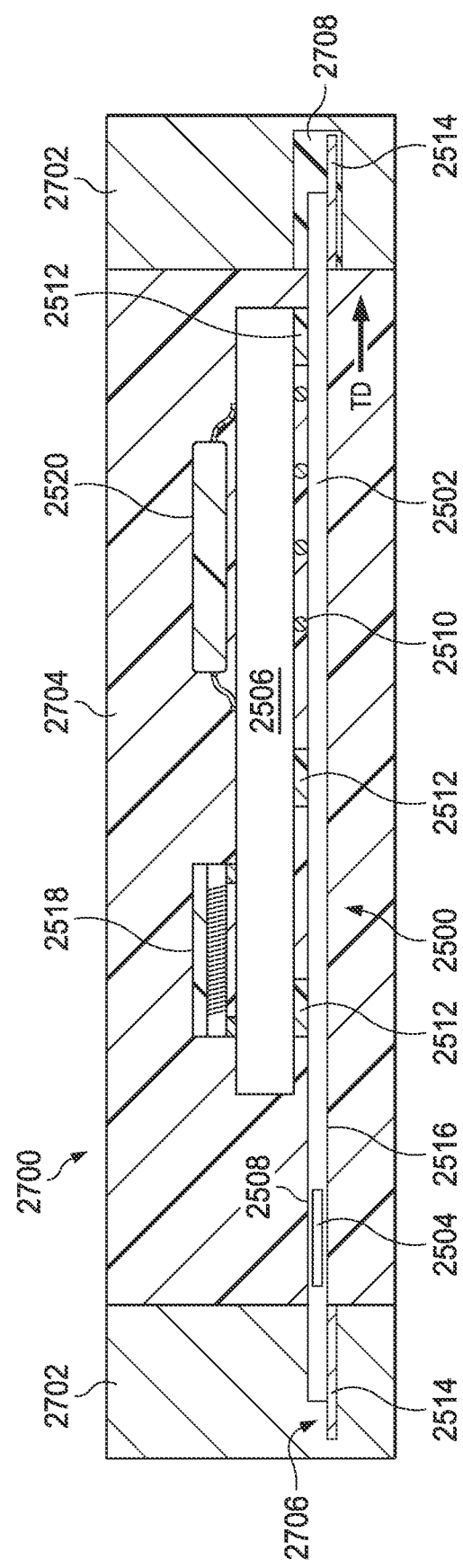
FIG. 27 is a cross-sectional view illustrating the example torque sensor system of FIGS. 25 and 26 mounted to a mechanical structure for sensing torsional stress applied to the structure FIGS. 25 and 26.

FIG. 27 illustrates an example application of the torque sensor system 2500 of FIG. 25 coupled to a mechanical structure 2700. The mechanical structure 2700 includes a housing 2702. The housing 2702 includes a fixed support 2706 at one end of the housing 2702 that secures the coupling layer 2514 and one end of the substrate 2502. The housing 2702 also includes a non-fixed support 2708 at an opposite end of the housing 2702. The coupling layer 2514 and an opposite end of the substrate 2502 are disposed in the non-fixed support 2708. The non-fixed support 2708 allows for movement of the carrier (i.e., the substrate 2502) in a thrust direction TD but not in a direction perpendicular to a plane of the substrate 2502. Thus, the torque sensor 2500 thus may be configured to measure stresses responsive to any force that displaces the substrate 2502 in a thrust direction.

Figure 28:
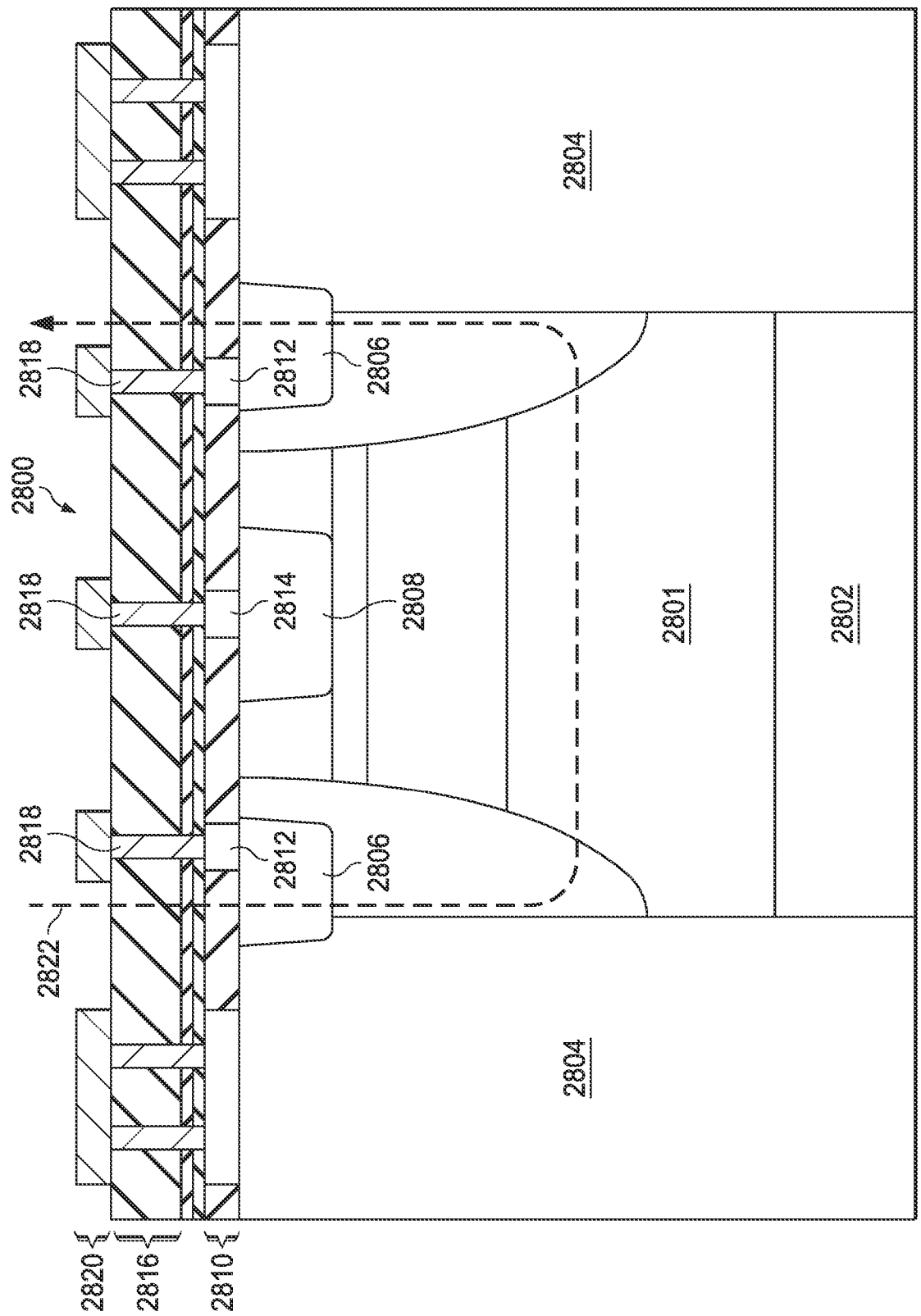
FIG. 28 is a cross section of an example reference resistor in a semiconductor substrate.

FIG. 28 is a cross-sectional view of an example reference piezoresistor 2800. The piezoresistor 2800 is a useful example of the reference piezoresistor 130 shown in FIG. 1B. The piezoresistor 2800 can be an n-type or alternatively a p-type resistor, depending on the type of dopant used to form the semiconductor substrate. A deep well 2801 is implanted with the opposite conductivity type of dopant into a doped substrate 2802. The substrate 2802 can include an epitaxial layer (not specifically shown). The deep well 2801 forms a buried layer and is highly doped to promote current flow and exhibit low resistance. Trenches 2804 are side wall doped deep trenches contacting opposite ends of the deep well 2801, and are highly doped for horizontal current flow and lower doped for vertical current flow. This causes the trenches 2804 to have a first piezo-resistive coefficient for current flow in lateral directions and a second, higher piezo-resistive coefficient for current flow in vertical directions.

Still referring to FIG. 28, wells 2806 are implanted into the surface of substrate 2802 to contact the trenches 2804, followed by the implantation of a well 2808 having a second opposite conductivity. A dielectric layer 2810 is then formed to cover the surface of substrate 2802. Contacts 2812 having the first conductivity type (e.g., N-type) are implanted in the wells 2806 (e.g., N-wells), and a contact 2814 having the second opposite conductivity (e.g., P-type) is implanted in the well 2808 having the second conductivity. An intermediate dielectric 2816 is deposited over the dielectric layer 2810, and vias 2818 are formed through the intermediate dielectric layer 2816 to the contacts 530 and the contact 525. A metallization layer 2820 is formed over vias 2818. During operation, as shown in FIG. 28, current 2822 flows from one well 2806 via the trenches 2804 and the deep well 2800 and up through the other well 2806.

Figure 29:
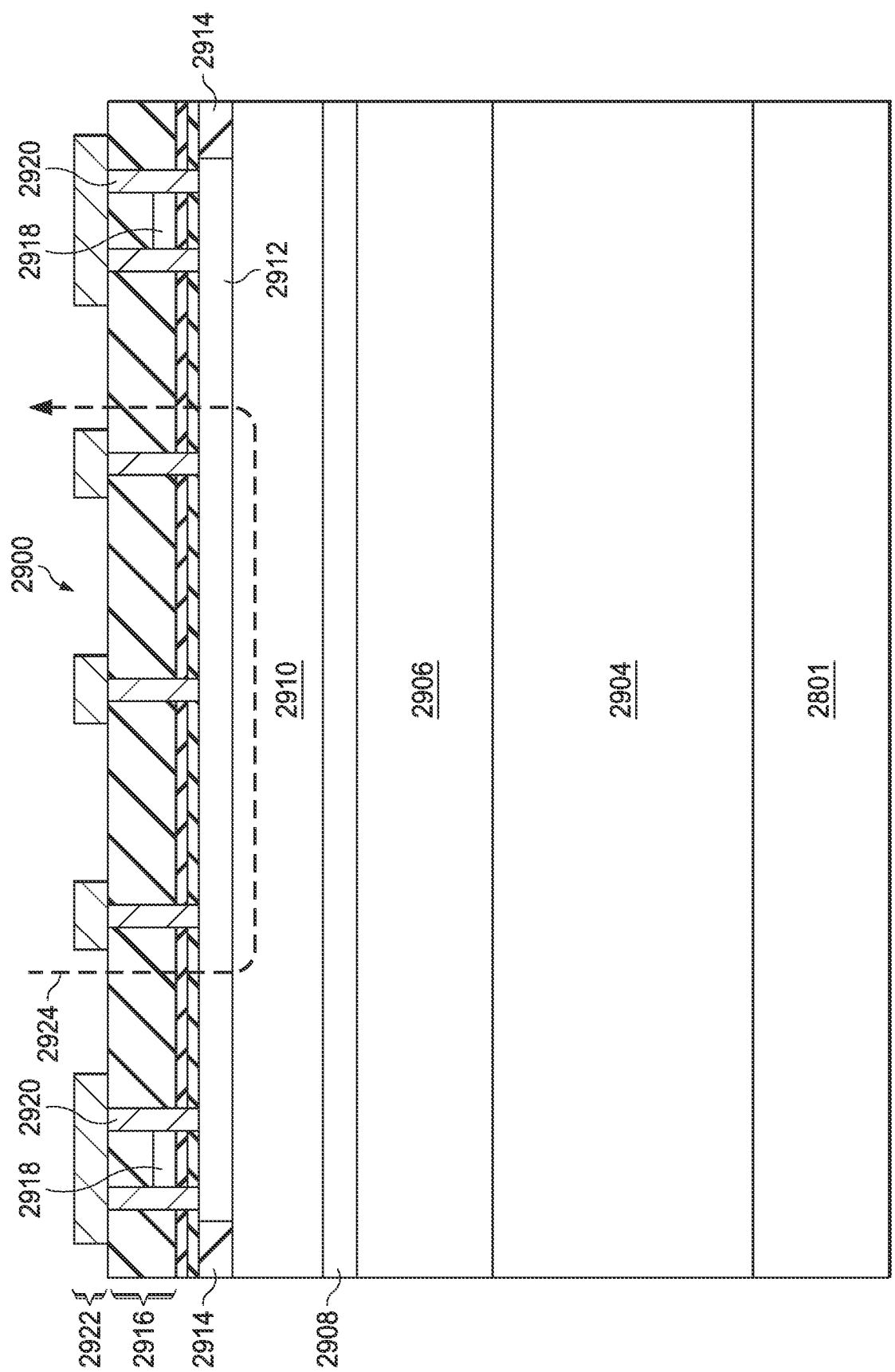
FIG. 29 is a cross section of an example sensing resistor in a semiconductor substrate.

FIG. 29 is a cross-sectional view of an example sensing piezoresistor 2900. The piezoresistor 2900 is a useful example a resistor element of the sensing piezoresistor 124 shown in FIG. 1B. For example, one or more sensing piezoresistor 2900 may be used to implement the sensing piezoresistor 124 and combined with the piezoresistor 2800 to form a piezoresistive sensor.

In the example of FIG. 29, the sensing piezoresistor 2900 is formed on a substrate 2801 (e.g., on the same substrate as piezoresistor 2800). The sensing piezoresistor 2900 may be formed as P-type of N-type diffusion resistor on a top surface of the substrate and be oriented to a particular crystal axis (e.g., oriented along [100], [010] or [110]). A buried layer 2904 is formed on in the substrate 2902. For example, the buried layer 2904 is formed by implanting dopants of a first conductivity type (e.g., N-type or P-type dopants). An epitaxial layer 2906 is formed over the buried layer 2904. Another buried layer 2908 is formed into the epitaxial layer 2906. For example, the buried layer 2908 is formed by implanting dopants having the opposite conductivity type as the buried layer 2904. A doped well region 2910 is formed in the buried layer 2908, such as by implanting dopants having the same conductivity type as the buried layer 2908 in which it is formed. Additional doped well region 2912 are formed on opposite sides of the well region 2910. The well regions are formed by implanting dopants having the opposite conductivity as the well region 2910, thus forming respective junctions between the respective well regions 2912 and 2910. For example, an N-type piezo resistor may be formed by implant N-type dopants to form well 2912 and P-type dopants for the well 2910.

A shallow trench isolation structure 2914 may be formed around the well region 2912. A dielectric layer 2916, which includes n respective contacts 2918, is formed over the well region 2912. Vias 2920 are formed through the dielectric layer 2916 to the respective contacts 2918. A metallization layer 2922 is formed over the vias 2920. Current 2924 flows from the n-contact 2918 at one end of the dielectric layer 2916 along junction between layers 2910 and 2912 and to the other n-contact 2918 at an opposite end of piezoresistor 2900.

In the examples described herein, a normal piezoresistive sensor (e.g., sensor 108 and/or 112) includes an arrangement of sensing resistors 2900 formed in a lateral plane parallel to the mounting surface of the substrate 2801. The resistances from the sensing resistors are compared to the resistance from the reference resistor 2800, which is in a vertical direction perpendicular to the lateral plane. The reference resistor can have the same temperature dependency as the associated sensing resistors 2900 by forming the resistors in the same substrate and with substantially the same doping concentrations. This ensures the sensing and reference resistors have the same temperature coefficient and respond to temperature changes in substantially the same way, preventing confusion of different temperature responses for actual stress on the sensing resistor.

Figure 30:
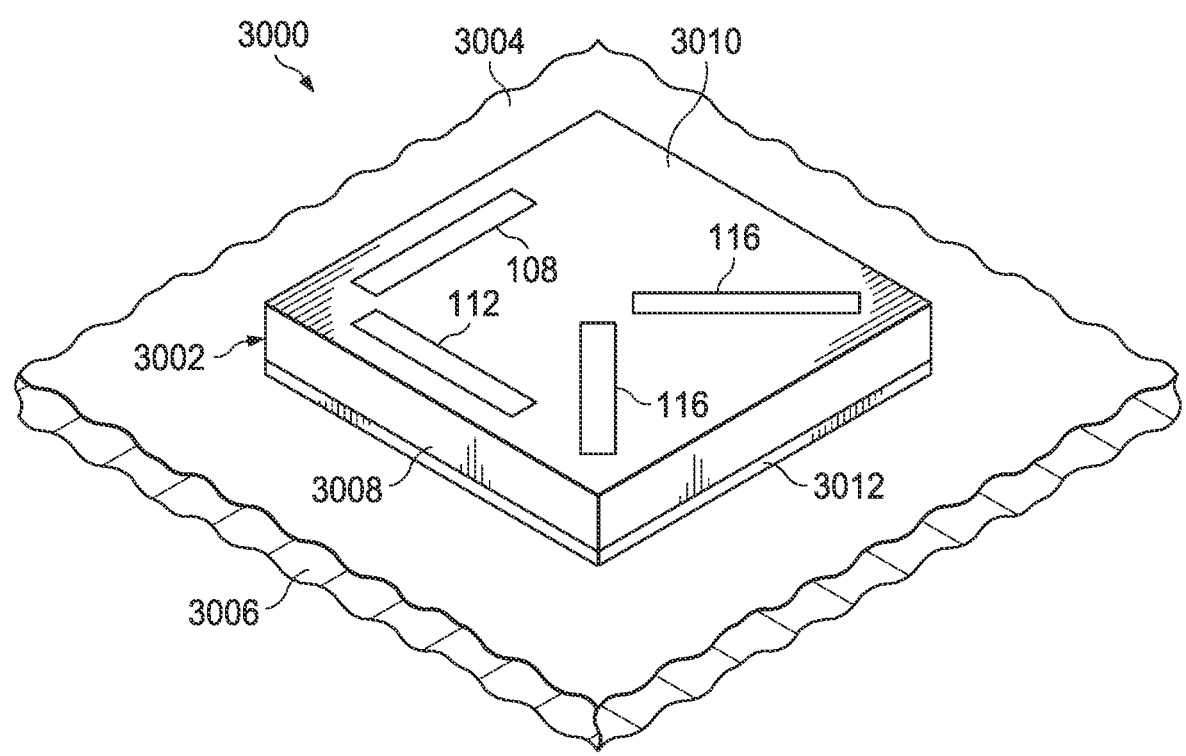
FIG. 30 is an example mounting method for mounting the torque sensor to a mechanical structure.

FIG. 30 is a perspective view of an example mounting assembly 3000 that includes an IC 3002 attached to a surface 3004 of a mechanical structure (e.g., shaft, beam, etc.) 3006. The IC 3002 includes a substrate 3008 and an arrangement of piezoresistive sensors, such as sensors 108, 112, 116 or otherwise described herein, disposed on a mounting surface 3010 of the substrate 3008. An interconnect 3012 is disposed between a contact surface (surface opposite that of the mounting surface 3010) of the substrate 3008 and the surface 3004 of the mechanical structure 3006. To enhance the interconnection between the IC 3002 and the mechanical structure 3006, prior to disposition of the interconnect 3012, one or both surfaces may be prepared through processing. The type of preparation used to prepare respective surfaces can vary depending on the material properties of the surface as well as the form of cohesive interconnect 3012. The preparation techniques may include texturing, patterning, cleaning, striping, etc. or any combination thereof.

One example of an interconnect 3012 between the substrate 3008 and the mechanical structure 3006 is a cohesive interconnect. A cohesive interconnect is an interconnection between two materials (e.g., metals) where the two materials essentially become one integrated joint. Examples of some different types of cohesive interconnects 3012 include, adhesives (e.g., epoxy), nanowires, welds (e.g., formed by welding process such as spot welding, ultrasonic welding or laser welding), and sinters (e.g., copper or silver sintering).

Another example of an interconnect 3012 includes a form fit interconnect where the interlocking of two connection members creates a positive connection. Form fitting connections have a tight tolerance where the connection members cannot become disengaged. Examples of form fitting interconnects include screws, clamps, press-fit hooks/bolts, tongue and groove and the like.

Still another example of an interconnect 3012 includes traction or friction connections where the static friction between adjacent surfaces of two connecting members prevents movement between the two connection members. For example, the mutual displacement of the two connection members is prevented so long as a counter-force caused by the static friction between the connecting members is not exceeded.

Some examples of the mounting methods described above may include silicon to metal (e.g., steel) bonding by induction heating. In the case of induction heating, the interconnect 3012 can include solder added to the contact surface of the substrate and/or to the prepared surface of the mechanical structure. Heat is generated to an isolated area several micrometers below the surface of the mechanical structure. A bond is then formed by a low temperature eutectic solder with adhesion layers of for example gold, silver, or nickel.

Another example includes laser micro-welding, such as where a lead frame of the IC is welded to the mechanical structure (e.g., a stainless steel shaft). In this example, the IC is either partially encapsulated by a material that can be welded to the mechanical structure or has a coupling layer (e.g., metal base layer) that can be welded to the mechanical structure to form the interconnect 3012.

Still yet another example of the interconnect 3012 includes plastic deformation and cold metal welding of plain (e.g., non-patterned) or patterned metal. In this example, both the contact surface of the substrate (or the coupling layer) and the prepared surface of the mechanical structure are patterned to increase the bonding. More specifically, sealing rings are patterned on both the contact surface and the prepared surface. When attached, the metal rings overlap and undergo plastic deformation. The metal rings can be cold welded to create metal-to-metal bonding and sealing between the respective parts.

Another example of the interconnect 3012 includes ultrasonic welding in which high-frequency ultrasonic acoustic vibrations are locally applied to workpieces being held together under pressure to create a solid-state weld. It is commonly used for plastics and metals, and especially for joining dissimilar materials. In ultrasonic welding, there are no connective bolts, nails, soldering materials, or adhesives necessary to bind the materials together. When applied to metals, a notable characteristic of ultrasonic welding is that the temperature stays well below the melting point of the involved materials thus preventing any unwanted properties or reactions that might arise from high-temperature exposure of the materials.

For each of example interconnect 3012 described herein, when attaching the IC to the mechanical structure, physical (e.g., electrical, mechanical and/or thermal) properties of the interconnect between the adjoining surfaces (i.e., the contact surface of the substrate and the prepared surface of the mechanical structure can be configured based on the application of the IC sensor. For example, in regards to mechanical properties, the mechanical connection between the joining surfaces can be configured as a stronger connection or a weaker connection based on the application. A strong joint connection increases the sensitivity of the sensors by transferring more stress from the surface of the mechanical structure to the sensor. As a result, a stronger mechanical connection may increase transfer of stress force such as in applications where sensitivity is crucial. Conversely, a weaker mechanical connection may decrease the amount of stress transfer to the sensor, which results in a decreased sensitivity of the sensor.

The mechanical properties of the interconnect 3012 can also be configured to be an isotropic or anisotropic. For the example of an anisotropic interconnect, the interconnect 3012 is configured to transfer stress to the sensor along one or more particular directions such that the sensor is more sensitive to stresses in respective direction in relation to other directions. In contrast, an isotropic interconnect 3012 may uniformly transfer stress from all directions from the mechanical structure to the sensor.

The electrical properties of the interconnect 3012 may also be configurable. For example, the interconnect may be formed of an electrically conductive material, an electrically insulating material or have a resistivity or dielectric permittivity configured based on the application.

The thermal properties of the interconnect 3012 may also be configurable. For example, interconnect may be formed of a material having a thermal conductivity to control thermal transfer between the two joining surfaces. The interconnect 3012 can have a high thermal conductivity for applications where it is desirable to expose the IC to the temperature of the mechanical structure (e.g., when the IC or SoC also includes a temperature sensor). Conversely, the interconnect 3012 can be formed of a material having a low thermal conductivity for applications where it is desirable to insulate the sensor from the temperature of the mechanical structure to which it is attached. In addition to thermal conductivity, the interconnect 3012, the substrate and the mechanical structure should be formed of materials having the same or similar thermal expansion coefficient. This ensures that the substrate and hence the IC expands and contracts at similar rates to that of the mechanical structure.

In this application, the term "couple" or "couples" means either an indirect or direct connection. Thus, if a first device couples to a second device, that connection may be through a direct connection or through an indirect connection via other devices and connections. For example, if device A generates a signal to control device B to perform an action: in a first example, device A is coupled to device B; or in a second example, device A is coupled to device B through intervening component C if intervening component C does not substantially alter the functional relationship between device A and device B, so device B is controlled by device A via the control signal generated by device A.

In this description, the recitation "based on" means "based at least in part on." Therefore, if X is based on Y, then X may be a function of Y and any number of other factors.

Modifications are possible in the described embodiments, and other embodiments are possible, within the scope of the claims.

What is claimed is:

1. An integrated circuit (IC), comprising:
a semiconductor substrate;
a first strain-sensitive sensor on or in the substrate and having a first sensing axis extending in a first direction parallel with a surface of the substrate;
a second strain-sensitive sensor on or in the substrate and having a second sensing axis extending in a second direction parallel with the surface of the substrate, the second direction being different than the first direction; and
a third strain-sensitive sensor on or in the substrate and having a third sensing axis extending in a third direction parallel with the surface of the substrate and different than the first and second directions,
wherein at least the first strain-sensitive sensor is a piezoresistive sensor that includes a first silicon resistor having a first terminal and a second terminal, and a second silicon resistor having a first terminal and a second terminal, the IC circuit further comprising:
a sense circuit having a first input, a second input and an output, the first input coupled to the first terminal of the first silicon resistor and the second input coupled to the first terminal of the second silicon resistor.

2. The IC of claim 1, wherein the substrate comprises a monolithic silicon substrate having a crystal orientation in a direction that is parallel to one of the first or second directions.

3. The IC of claim 2, wherein each of the second and third strain-sensitive sensors is a respective piezoresistive sensor comprising:
a first silicon resistor having a first terminal and a second terminal; and
a second silicon resistor having a first terminal and a second terminal, wherein
the first input of the sense circuit is coupled to the first terminal of the first silicon resistor of each of the second and third piezoresistive sensors and the second input of the sense circuit is coupled to the first terminal of the second silicon resistor of each of the second and third piezoresistive sensors.

4. The IC of claim 3, wherein the first silicon resistor of the first and second piezoresistive sensors has a resistance that varies responsive to deformation of the substrate, and the second silicon resistor of at least one of the first or second piezoresistive sensors has a resistance that does not vary in response to deformation of the substrate.

5. The IC of claim 4, wherein the first and second silicon resistors of the first piezoresistive sensor have respective sensing axes parallel to the direction of crystal orientation, the sense circuit configured to provide a first sensor signal at the output thereof, the first sensor signal is representative of a difference in resistance between the first and second silicon resistors of the first piezoresistive sensor responsive to stress applied to the substrate parallel to the direction of crystal orientation, and
wherein the first and second silicon resistors of the second piezoresistive sensor have respective sensing axes normal to the direction of crystal orientation, the sense circuit configured to provide a second sensor signal at the output thereof, the second sensor signal is representative of a difference in resistance between the first and second silicon resistors of the second piezoresistive sensor responsive to force applied to the substrate normal to the direction of crystal orientation.

6. The IC of claim 5, wherein the first and second silicon resistors of the third piezoresistive sensor have respective sensing axes oriented at +45 degrees and −45 degrees with respect to the direction of crystal orientation of the substrate, the sense circuit configured to provide a respective sensor signal representative of shear force applied to the substrate.

7. The IC of claim 4, wherein the first silicon resistor of the first piezoresistive sensor comprises:
sensing piezoresistor elements on or in the substrate with respective sensing axes parallel to the first sensing axis of the first piezoresistive sensor; and
one or more compensation piezoresistor elements on or in the substrate with a respective sensing axis transverse to the first sensing axis, in which a change in resistance of the one or more compensation piezoresistor elements cancels a change in resistance of the sensing piezoresistor elements due to stress transverse to the sensing axis of the first piezoresistive sensor.

8. The IC of claim 3, wherein the sense circuit is configured to provide respective sense signals, the sense signals are representative of a change in resistance of the respective first, second, and third piezoresistive sensors responsive to deformation of the substrate, the IC further comprising a temperature sensor on or in the substrate, the temperature sensor configured to provide a temperature signal representative of a temperature of substrate, the IC configured to compensate the sense signals over temperature responsive to the temperature signal.

9. The IC of claim 1, wherein the substrate comprises a contact surface that is spaced apart from an opposing surface, the contact surface being adapted to couple the IC to a mechanical structure, further comprising a coupling layer attached to the contact surface of the substrate, the coupling layer adapted to couple the IC to the mechanical structure.

10. The IC of claim 9 implemented in a sensing system, the sensing system comprising:
a communication device mounted on the opposing surface, the communication device configured to communicate sensor data between the IC and external reader devices; and
a controller mounted to the opposing surface and coupled to the communication device.

11. The sensing system of claim 10, wherein the communication device communicates via either a wired connection or a wireless connection.

12. The sensing system of claim 10 implemented as a system on chip (SoC), the SoC comprising a packaging material that encapsulates the IC and at least one of the communication device and the controller.

13. The system of claim 12, wherein the IC is a first IC and wherein the SoC further comprises a second IC as part of a multi-chip module also encapsulated within the packaging material, the second IC comprising the controller, wherein the controller comprises at least one of a state machine, a microcontroller and a microprocessor.

14. A system, comprising:
an integrated circuit (IC) including strain-sensitive sensors on or in a semiconductor substrate, the substrate having a crystal orientation, each of the strain-sensitive sensors having a respective sensing axis oriented at an angle relative to the crystal orientation of the substrate, the IC including a sense circuit configured to determine a change in resistance for each of the respective strain-sensitive sensors responsive to deformation of the substrate;
a communication device coupled to the IC, the communication device configured to wirelessly communicate data representative of the deformation of the substrate responsive to the change in resistance; and a controller coupled to the IC and the communication device, the controller configured to control communication the communication device, wherein at least one of the strain-sensitive sensors is a piezoresistive sensor including a first silicon resistor having a resistance that varies in responsive to deformation of the substrate and a second silicon resistor having a resistance that does not vary in response to deformation of the substrate.

15. The system of claim 14, wherein the strain-sensitive sensors comprise:

a first strain-sensitive sensor on or in the substrate to have a first sensing axis extending in a first direction parallel to a surface of the substrate and to the crystal orientation of the substrate;

a second strain-sensitive sensor on or in the substrate and having a second sensing axis extending in a second direction transverse to the crystal orientation of the substrate and parallel to the surface of the substrate and perpendicular to the first direction; and a third strain-sensitive sensor on or in the substrate and having a third sensing axis extending in a third direction parallel with the surface of the substrate and neither parallel nor perpendicular to the first and second directions, wherein the sense circuit is coupled to the first, second, and third strain-sensitive sensors, the sense circuit configured to provide a sense signal representative of a change in resistance of each of the first, second, and third strain-sensitive sensors responsive to the deformation of the substrate.

16. The system of claim 15, wherein the first, second and third strain-sensitive sensors are respective first, second and third piezoresistive sensors, each comprising:

a first silicon resistor; and a second silicon resistor, wherein each first silicon resistor has a resistance that varies responsive to deformation of the substrate, and each second silicon resistor has a resistance that does not vary in response to deformation of the substrate.

17. The system of claim 16, wherein the first and second silicon resistors of the first piezoresistive sensor have respective sensing axes parallel to the crystal orientation, the sense circuit configured to provide a first sensor signal at a first output thereof, the first sensor signal is representative of a difference in resistance between the first and second silicon resistors of the first piezoresistive sensor responsive to normal stress applied to the substrate parallel to the crystal orientation, and wherein the first and second silicon resistors of the second piezoresistive sensor have respective sensing axes normal to the crystal orientation, the sense circuit configured to provide a second sensor signal at a second output thereof, the second sensor signal is representative of a difference in resistance between the first and second silicon resistors of the second piezoresistive sensor responsive to normal stress applied to the substrate normal to the crystal orientation.

18. The system of claim 17, wherein the first and second silicon resistors of the third piezoresistive sensor have respective sensing axes oriented at +45 degrees and −45 degrees with respect to the direction of crystal orientation of the substrate, the sense circuit configured to provide a respective sensor signal representative of shear force applied to the substrate.

19. The system of claim 16, wherein the first silicon resistor of the first piezoresistive sensor comprises:

sensing piezoresistor elements on or in the substrate with respective sensing axes parallel to the first direction; and one or more compensation piezoresistor elements on or in the substrate with a respective sensing axis transverse to the first direction, in which a change in resistance of the one or more compensation piezoresistor elements cancels a change in resistance of the sensing piezoresistor elements due to stress transverse to the first direction.

20. The system of claim 15, further comprising a temperature sensor on or in the surface of the substrate, the temperature sensor configured to provide a temperature signal representative of a temperature of the substrate, the controller configured to compensate the sense signal the temperature responsive to the temperature signal.

21. The system of claim 14 implemented as a system on chip (SoC), the SoC comprising a packaging material that encapsulates the IC and at least one of the communication device and the controller.

22. The system of claim 21, wherein the IC is a first IC and wherein the SoC further comprises a second IC as part of a multi-chip module also encapsulated within the packaging material.

23. An integrated circuit (IC) comprising:

strain-sensitive sensors on or in a semiconductor substrate, the substrate having a crystal orientation, the strain-sensitive sensors comprising:

a first strain-sensitive sensor on or in the substrate to have a first sensing axis extending in a first direction parallel to a surface of the substrate and to the crystal orientation of the substrate;

a second strain-sensitive sensor on or in the substrate and having a second sensing axis extending in a second direction transverse to the crystal orientation of the substrate and parallel to the surface of the substrate, the second direction is perpendicular to the first direction; and a third strain-sensitive sensor on or in the substrate and having a third sensing axis extending in a third direction parallel with the surface of the substrate and neither parallel nor perpendicular to the first and second directions; and a sense circuit coupled to each of the first, second and third strain-sensitive sensors, the sense circuit configured to provide respective sense signals, the sense signals are representative of a change in resistance of the respective first, second, and third strain-sensitive sensors responsive to deformation of the substrate, wherein at least one of the first and second strain-sensitive sensors is a piezoelectric resistive sensor including a first silicon resistor having a resistance that varies responsive to deformation of the substrate and a second silicon resistor having a resistance that does not vary in response to deformation of the substrate.

24. The IC of claim 23, wherein the first and second strain-sensitive sensors are respective first and second piezoresistive sensors, each comprising:

a first silicon resistor; and a second silicon resistor, wherein each first silicon resistor has a resistance that varies responsive to the deformation of the substrate, and each second silicon resistor has a resistance that does not vary in response to deformation of the substrate.

25. The IC of claim 24, wherein the first silicon resistor of the first piezoresistive sensor comprises:

sensing piezoresistor elements on or in the substrate with respective sensing axes parallel to the first direction; and one or more compensation piezoresistor elements on or in the substrate with a respective sensing axis transverse to the first direction, in which a change in resistance of the one or more compensation piezoresistor elements cancels a change in resistance of the sensing piezoresistor elements due to stress transverse to the first direction.

26. The IC of claim 24, wherein the third strain-sensitive sensor is a third piezoresistive sensor having first and second silicon resistors, the first and second silicon resistors of the third piezoresistive sensor have respective sensing axes oriented at +45 degrees and −45 degrees with respect to the direction of crystal orientation of the substrate, the sense circuit configured to provide a respective sensor signal representative of shear force applied to the substrate.

* * * * *